(12) United States Patent
Seo et al.

(10) Patent No.: US 7,507,594 B2
(45) Date of Patent: Mar. 24, 2009

(54) CONTACT PORTION AND MANUFACTURING METHOD THEREOF, THIN FILM TRANSISTOR ARRAY PANEL AND MANUFACTURING METHOD THEREOF

(75) Inventors: Jong-Hyun Seo, Seoul (KR); Mun-Pyo Hong, Seongnam-si (KR); Dae-Ok Kim, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 383 days.

(21) Appl. No.: 10/554,718

(22) PCT Filed: Feb. 11, 2005

(86) PCT No.: PCT/KR2005/000392

§ 371 (c)(1),
(2), (4) Date: Oct. 28, 2005

(87) PCT Pub. No.: WO2005/078790

PCT Pub. Date: Aug. 25, 2005

(65) Prior Publication Data

US 2006/0258059 A1   Nov. 16, 2006

(30) Foreign Application Priority Data

Feb. 11, 2004   (KR) .................. 10-2004-0008956

(51) Int. Cl.
*H01L 21/00*   (2006.01)

(52) U.S. Cl. .............................. 438/34; 257/59; 349/43
(58) Field of Classification Search .................. 257/59; 349/43; 438/34
See application file for complete search history.

(56) References Cited

U.S. PATENT DOCUMENTS

| 6,524,876 | B1 | 2/2003 | Baek et al. | |
| 6,639,265 | B2* | 10/2003 | Arao et al. | 257/303 |
| 6,924,864 | B2* | 8/2005 | Kim | 349/141 |
| 2001/0019125 | A1 | 9/2001 | Hong et al. | |
| 2003/0058379 | A1 | 3/2003 | Lee | |

FOREIGN PATENT DOCUMENTS

EP   1 041 622 A1   10/2000

\* cited by examiner

*Primary Examiner*—Asok K Sarkar
(74) *Attorney, Agent, or Firm*—Cantor Colburn LLP

(57) ABSTRACT

A method of manufacturing a contact portion is provided, which includes: forming a first signal line on a substrate (110), forming a insulating layer (140) covering the first signal line and having a contact hole (182, 185) exposing the first signal line; forming a contact layer (700) on the exposed surface of the first signal through the contact hole; and forming a second signal line (82, 190) connected to the first signal line via the contact layer. Wherein the first signal line is made of Al or Al alloy, and the second signal line is made of ITO or IZO.

28 Claims, 25 Drawing Sheets

[Fig. 1]
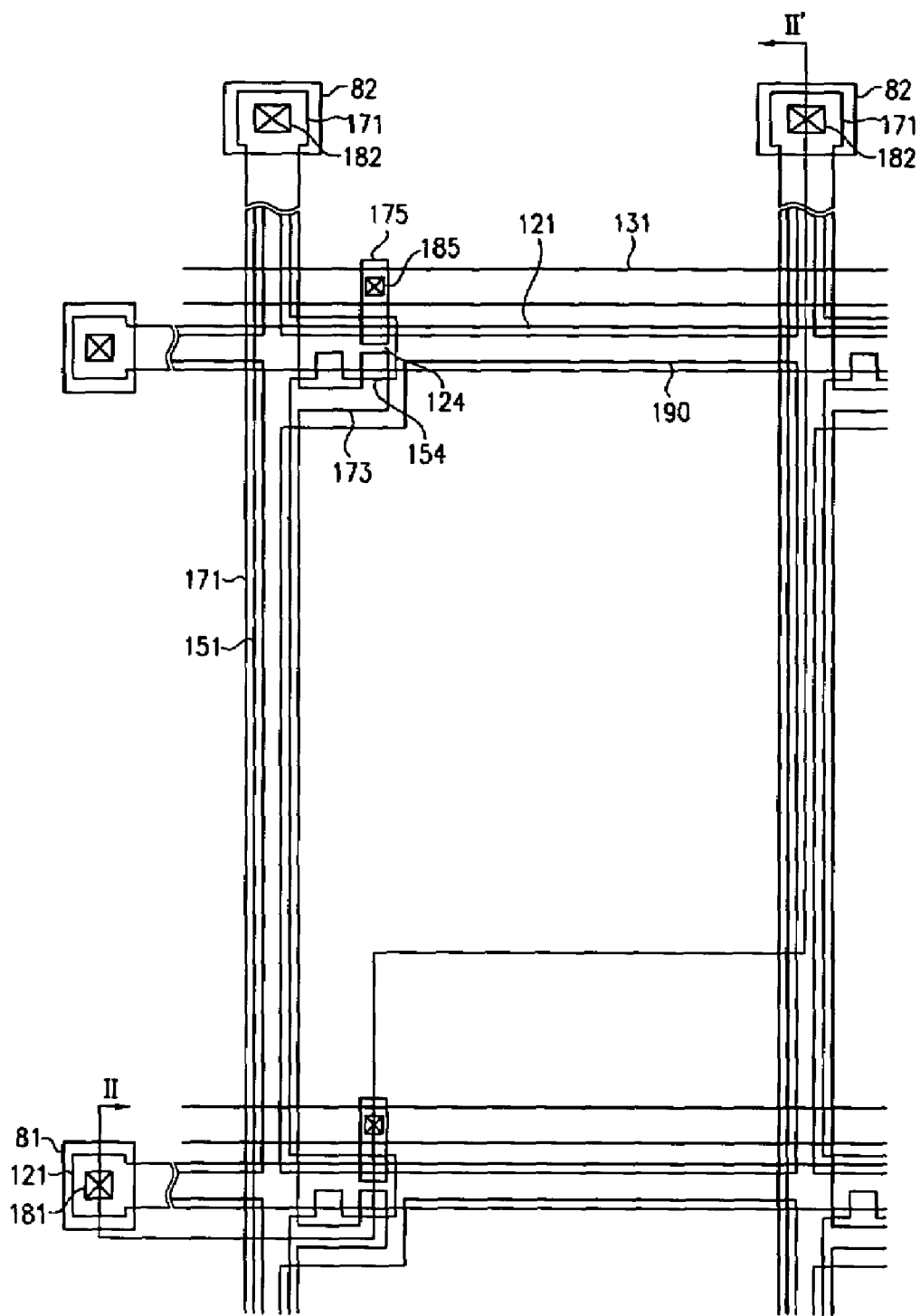

[Fig. 2]
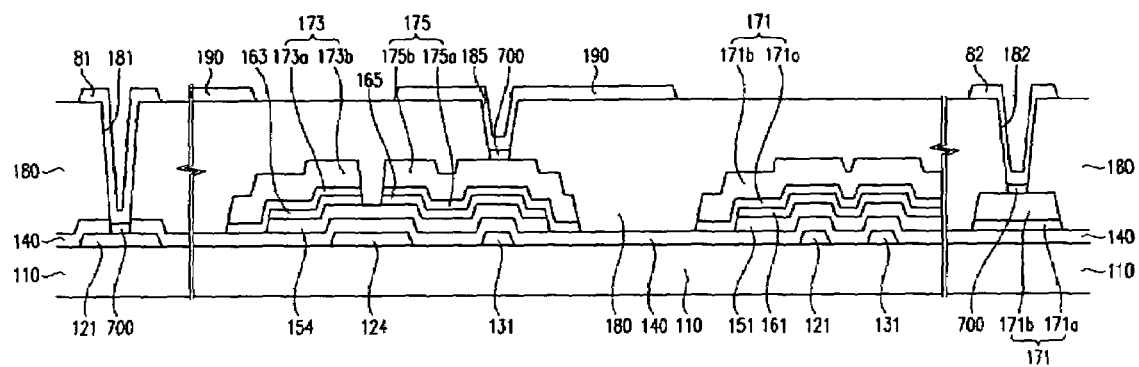

[Fig. 3]
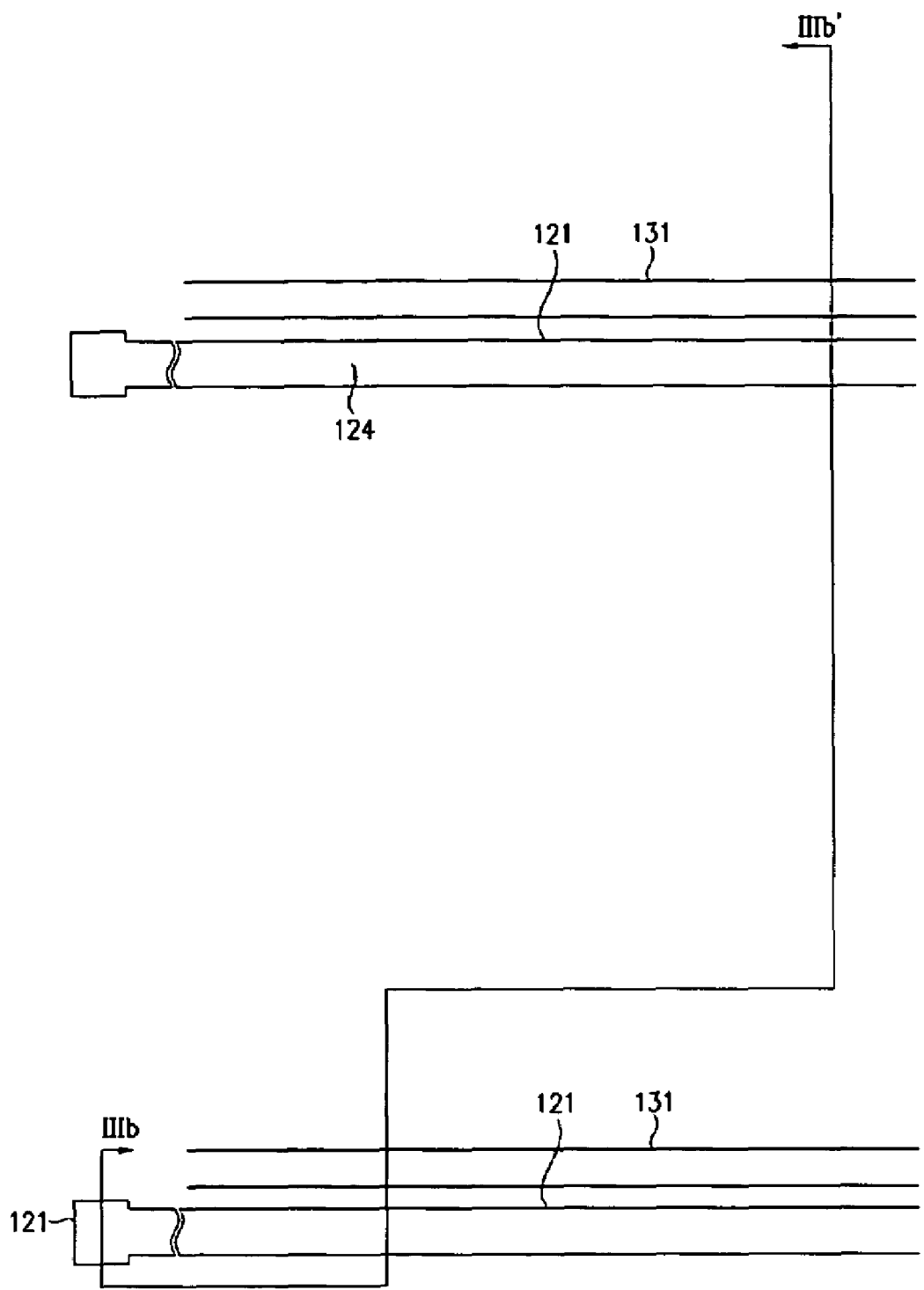

[Fig. 4]
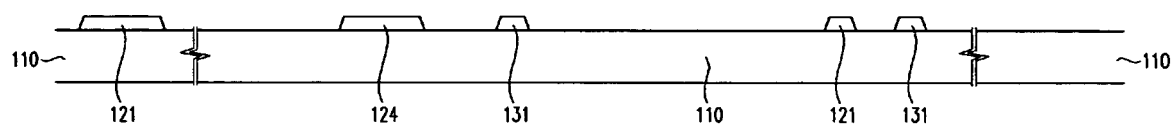

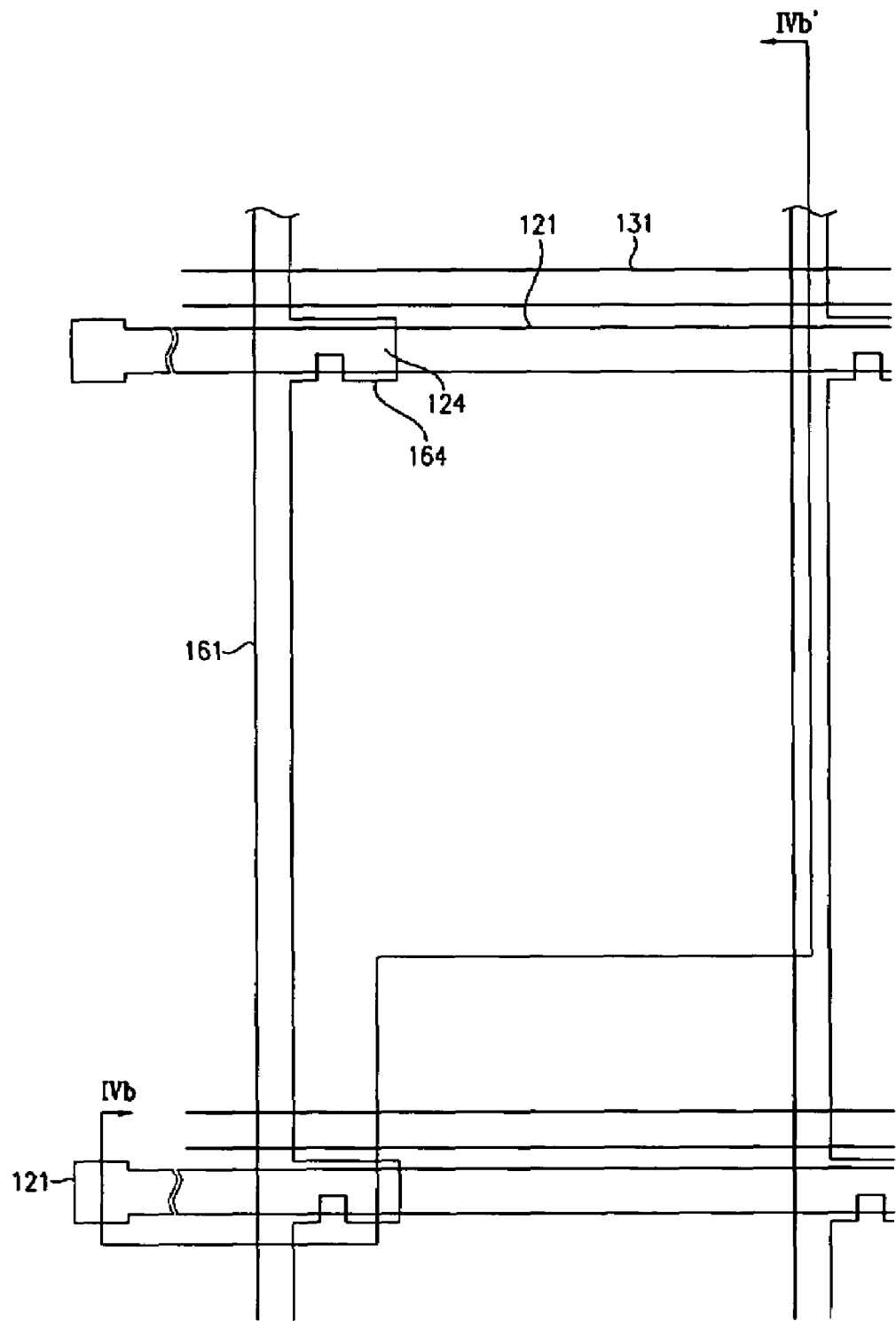
[Fig. 5]

[Fig. 6]
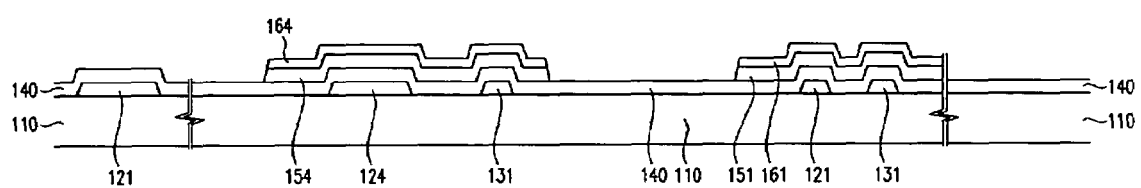

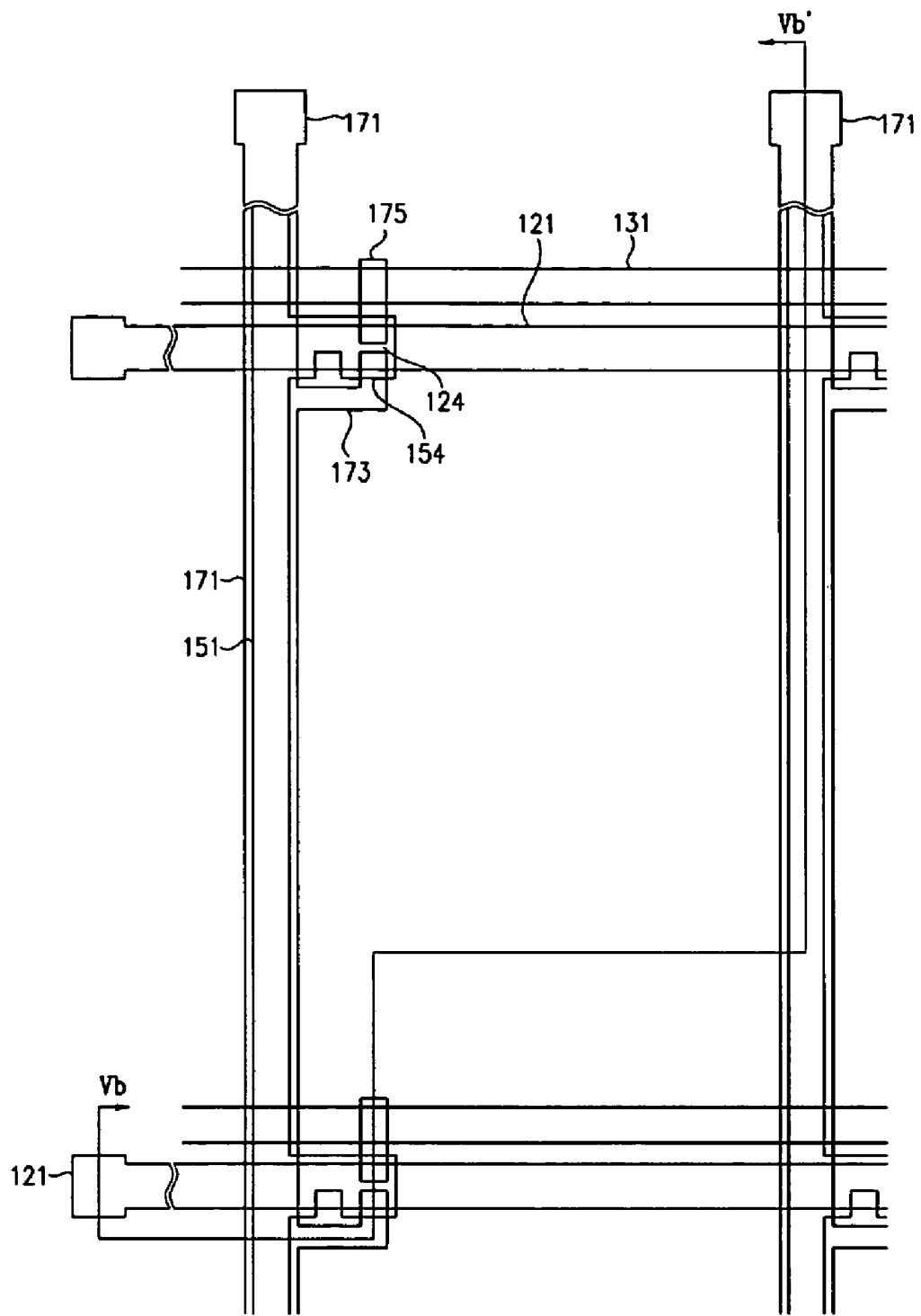
[Fig. 7]

[Fig. 8]
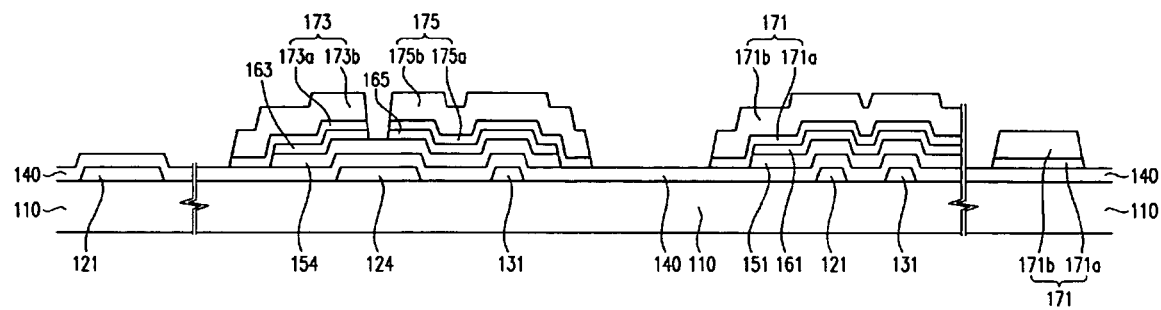

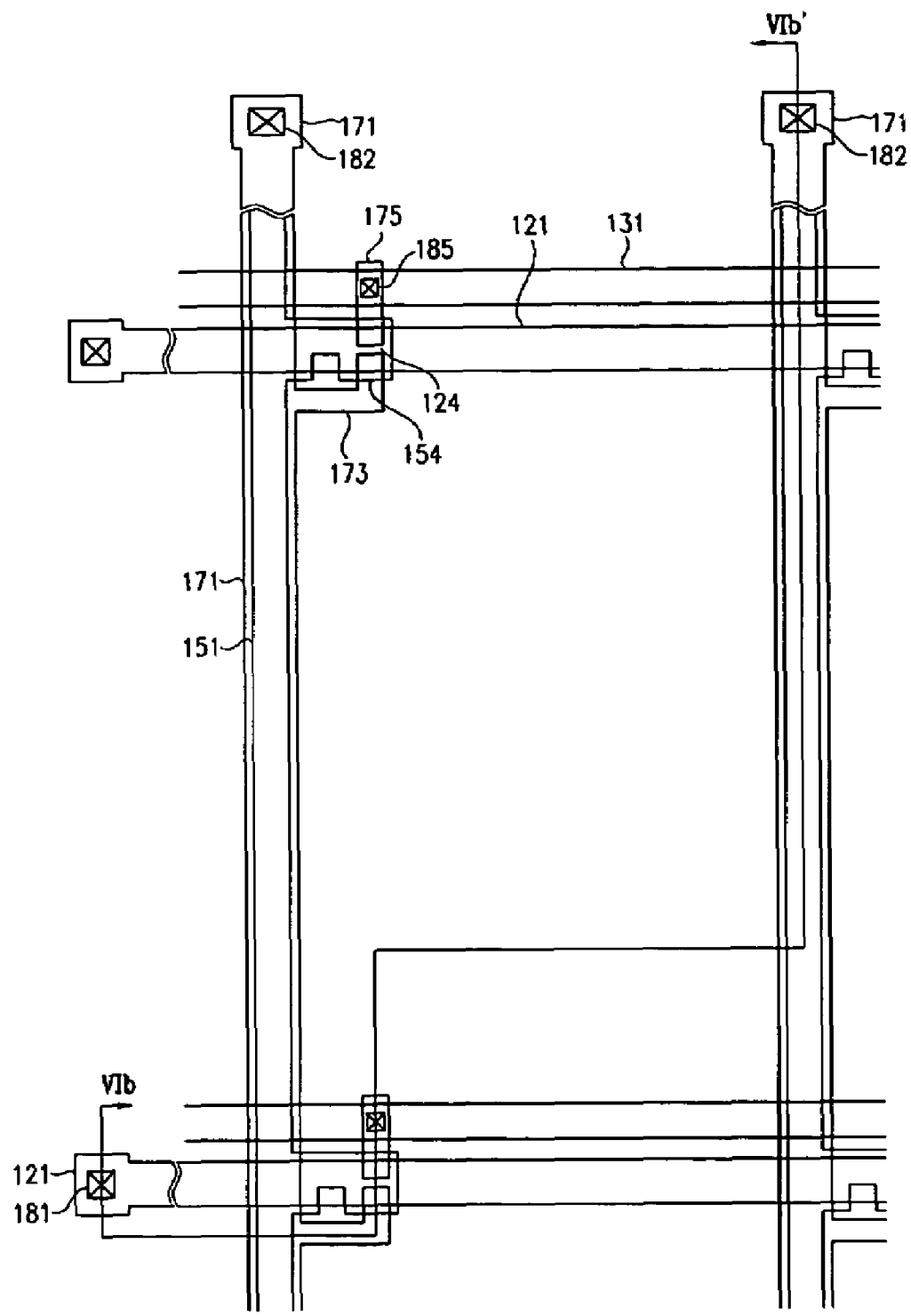
[Fig. 9]

[Fig. 10]
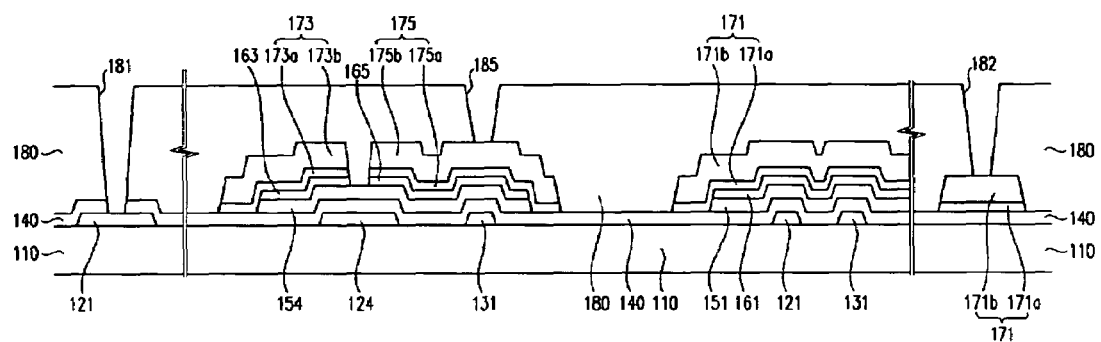
[Fig. 11]
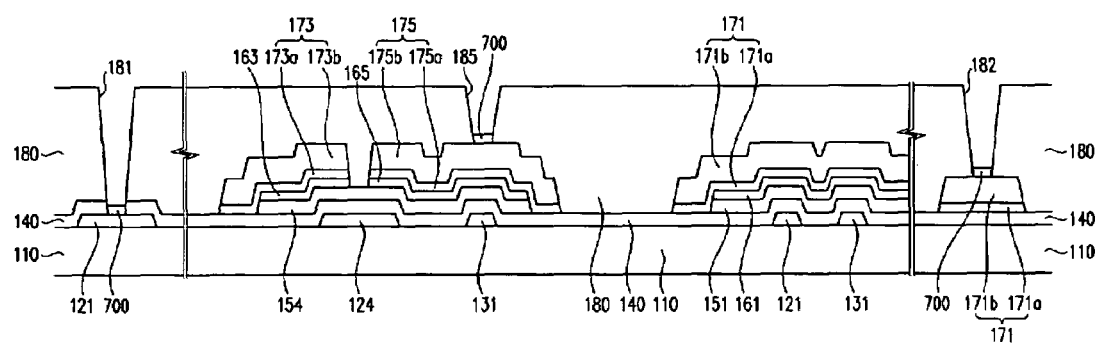

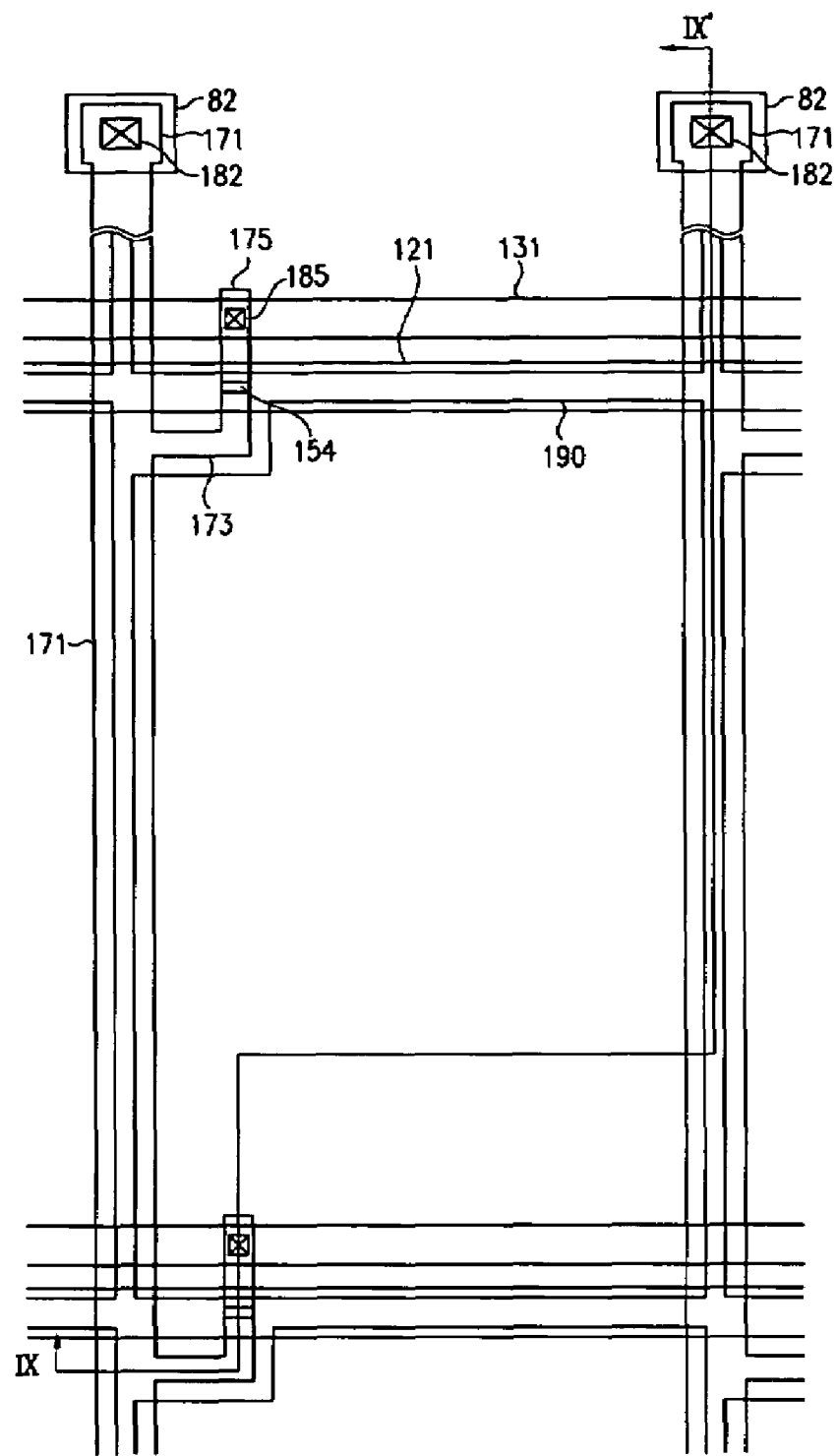
[Fig. 12]

[Fig. 13]
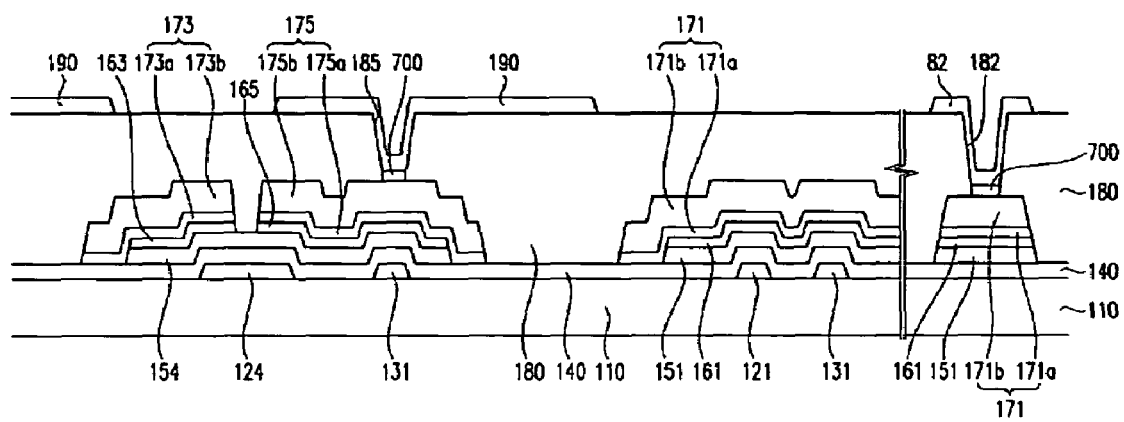

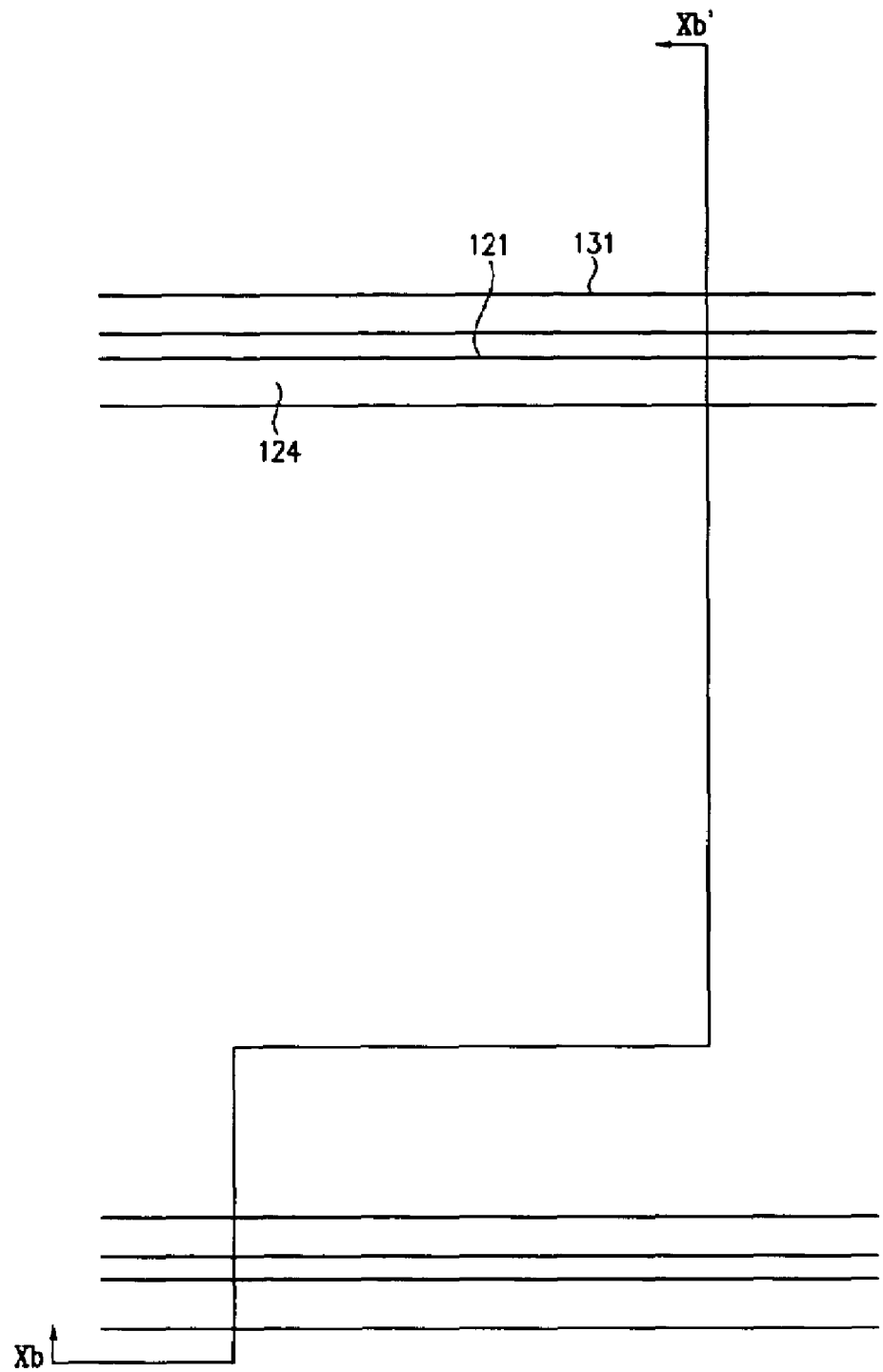
[Fig. 14]

[Fig. 15]
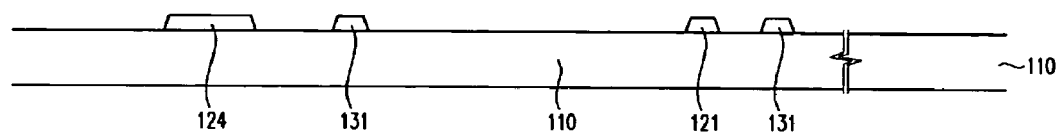
[Fig. 16]
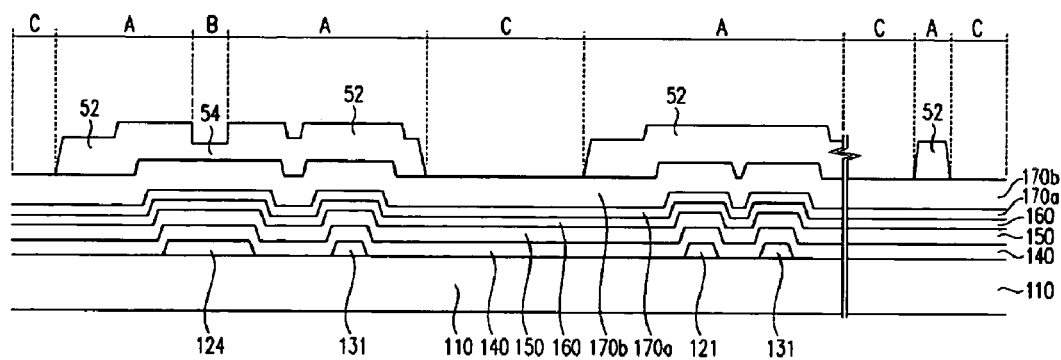

[Fig. 17]
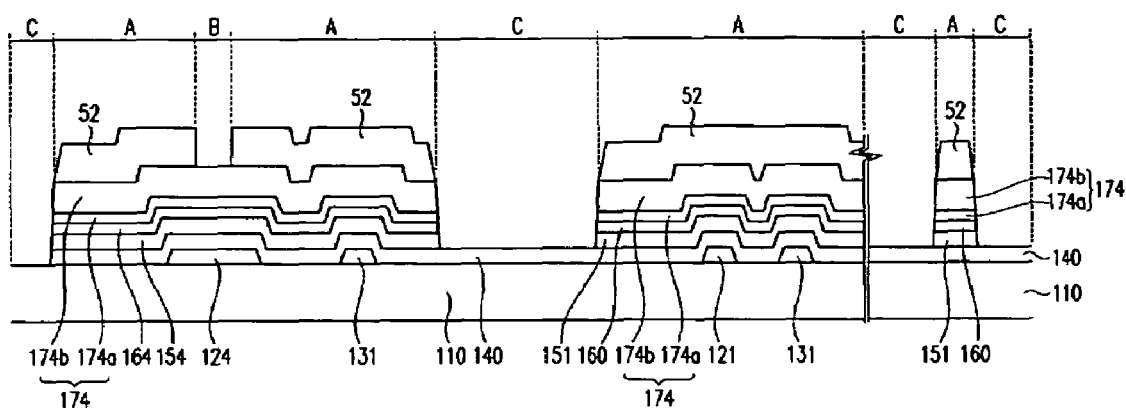

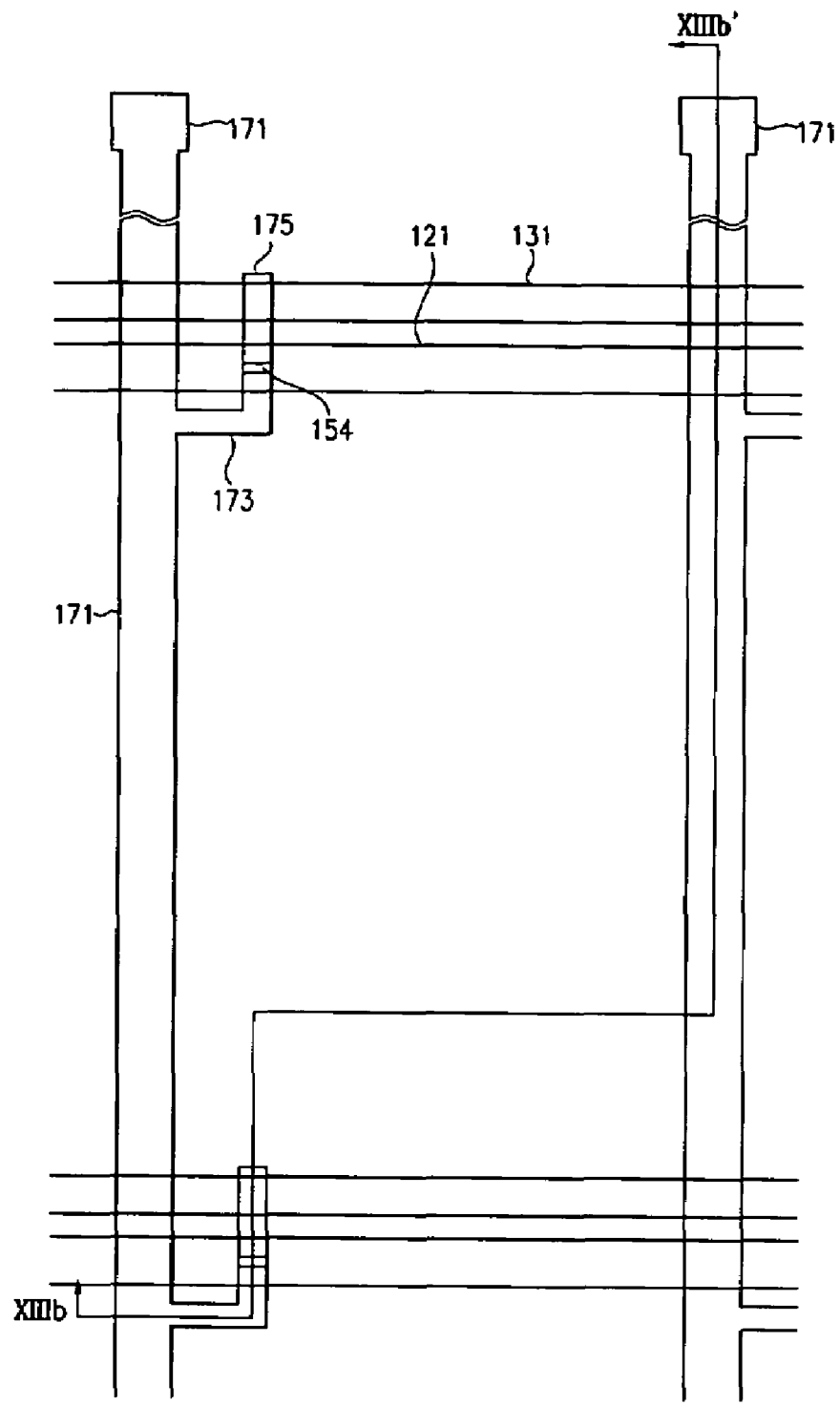
[Fig. 18]

[Fig. 19]
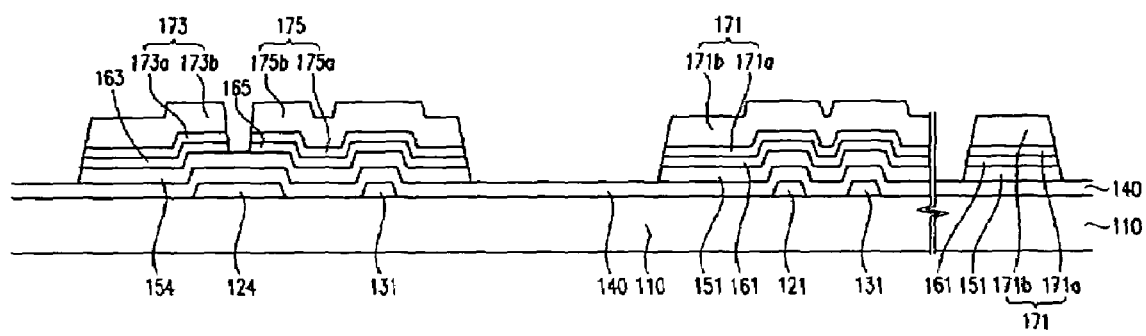

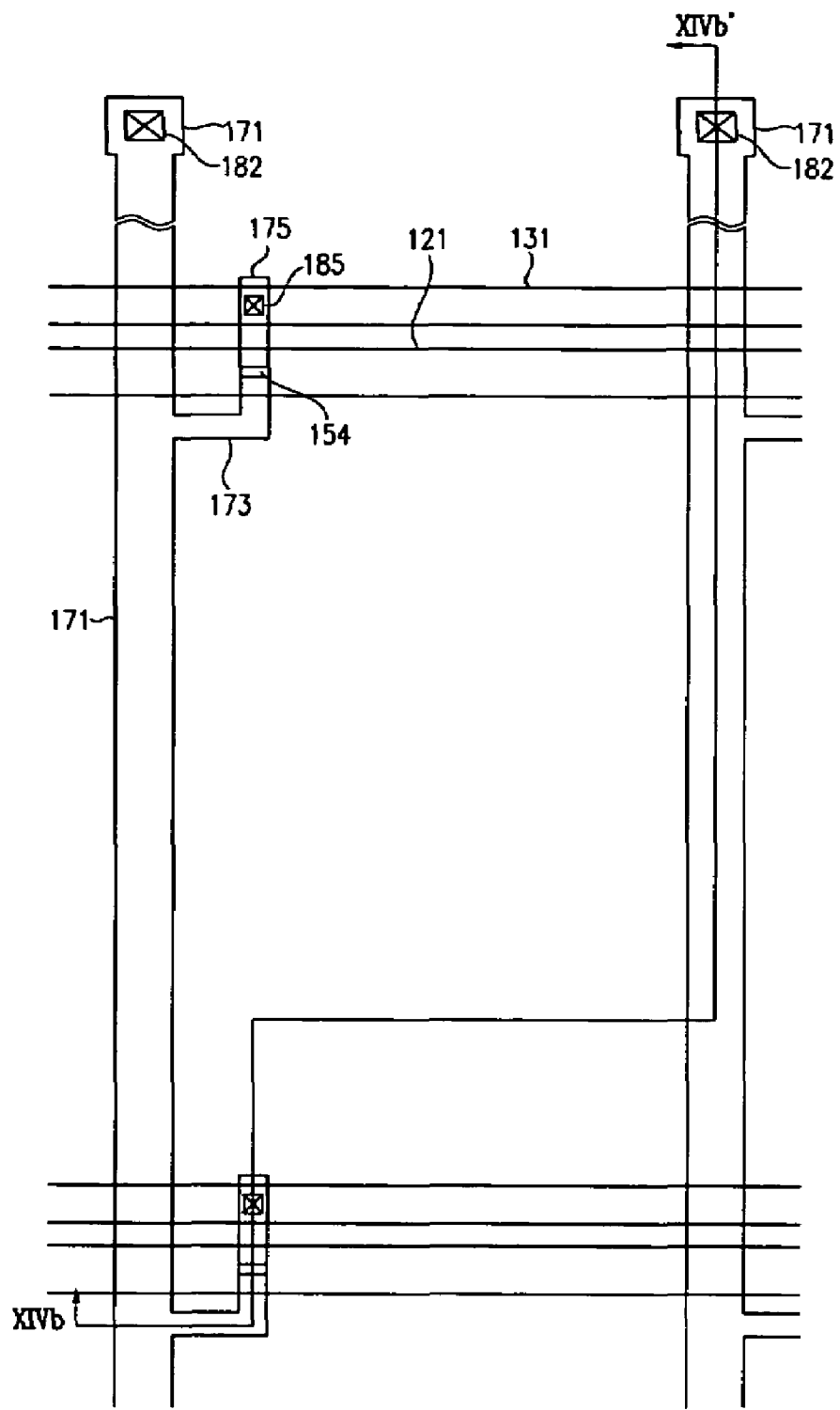
[Fig. 20]

[Fig. 21]
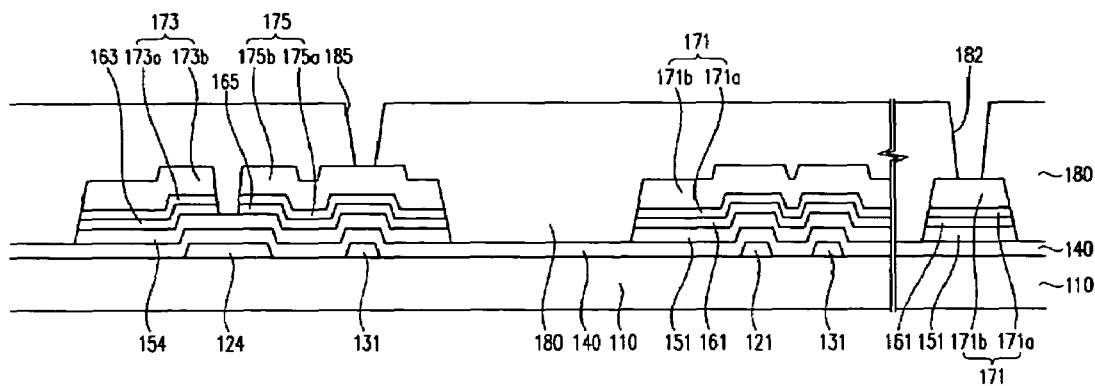
[Fig. 22]
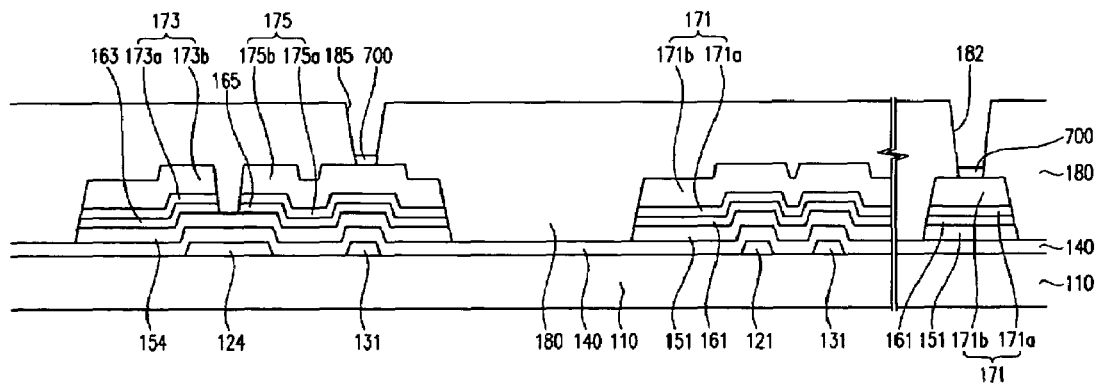

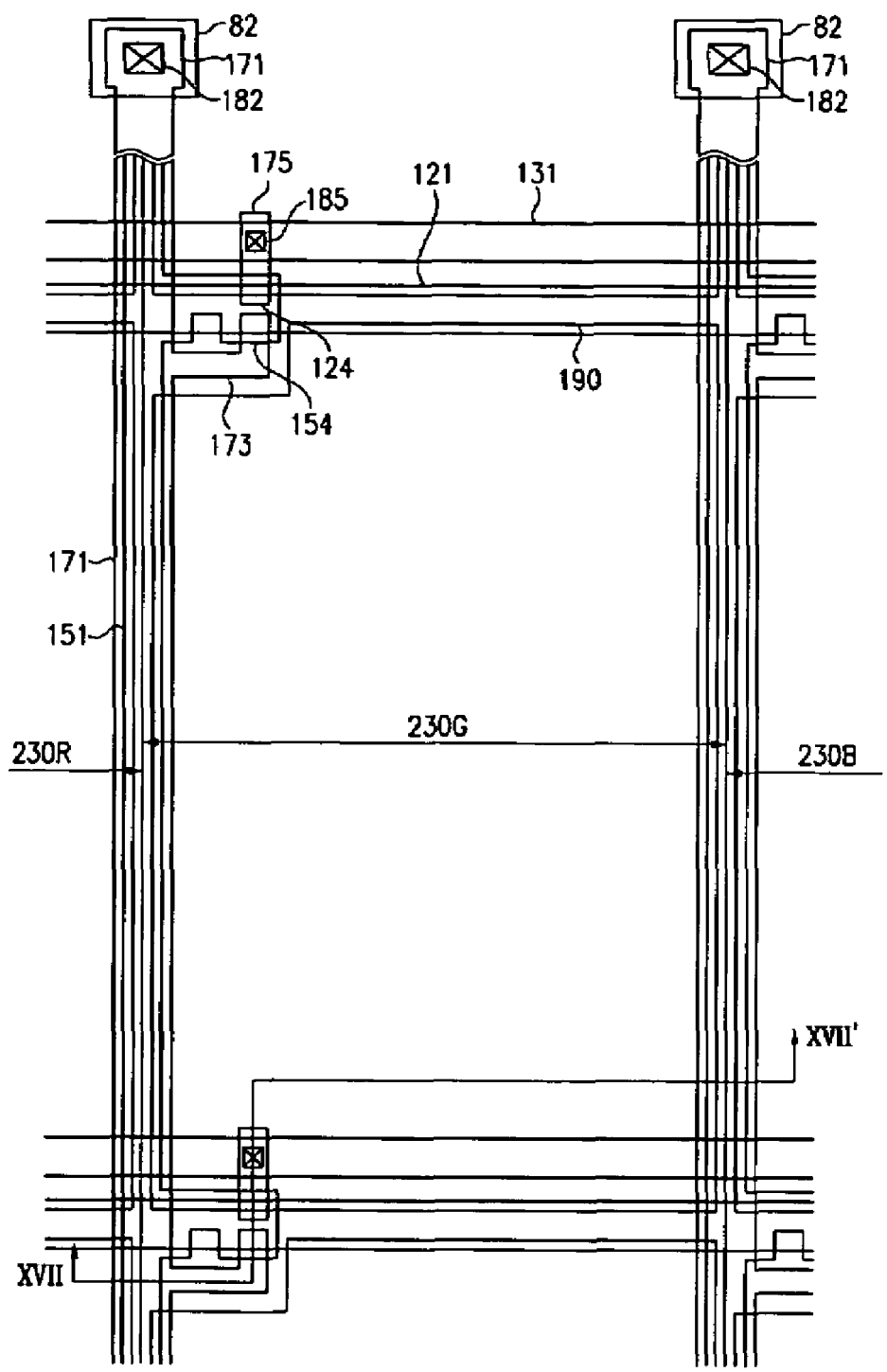
[Fig. 23]

[Fig. 24]
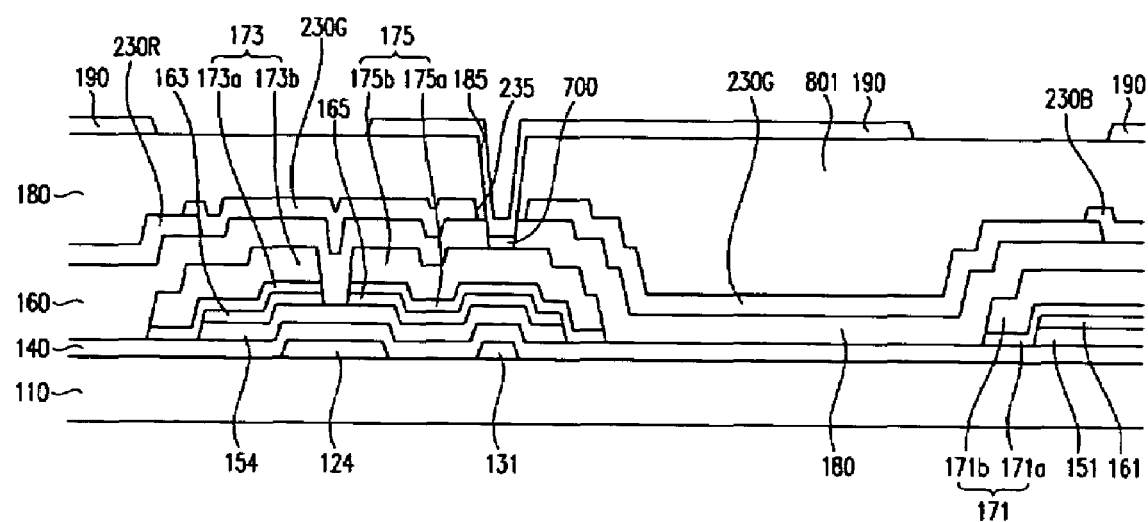

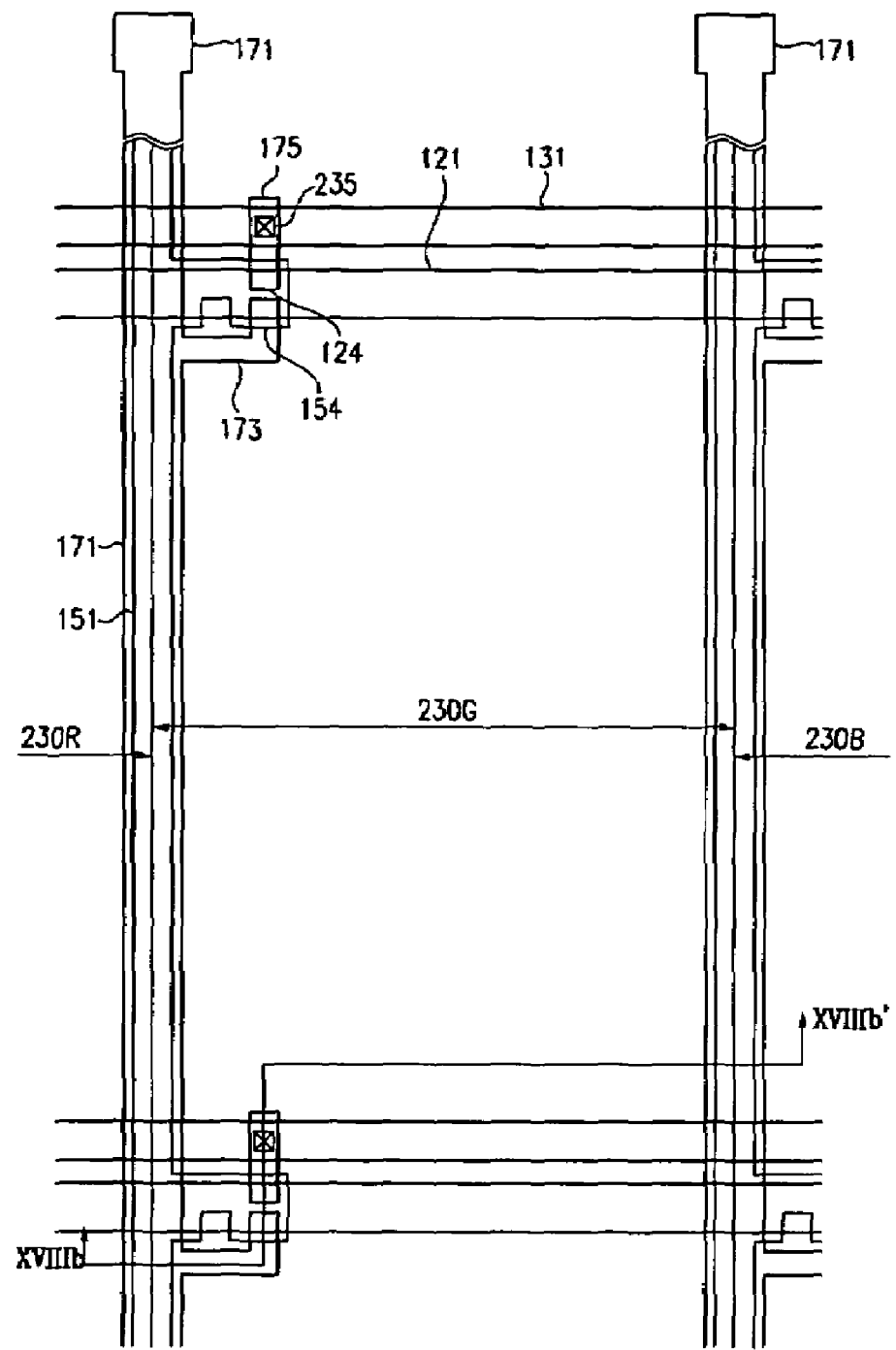
[Fig. 25]

[Fig. 26]
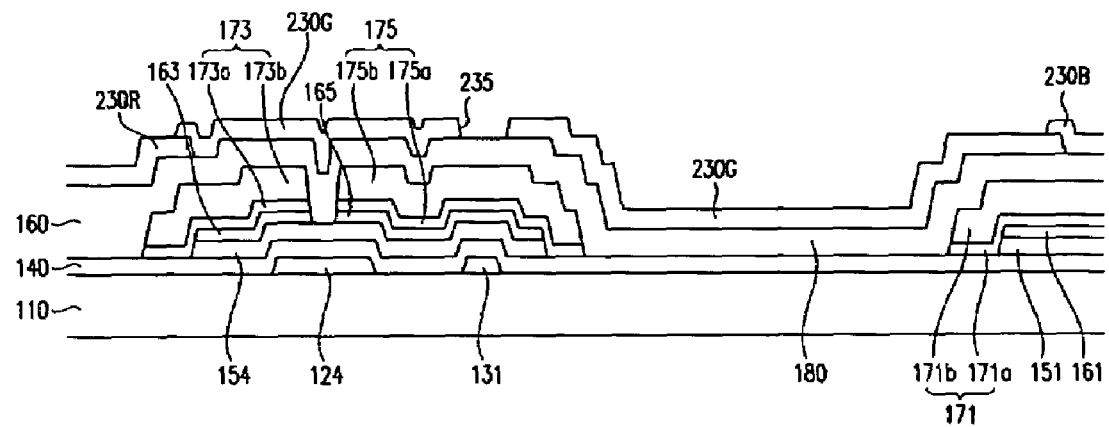

[Fig. 27]
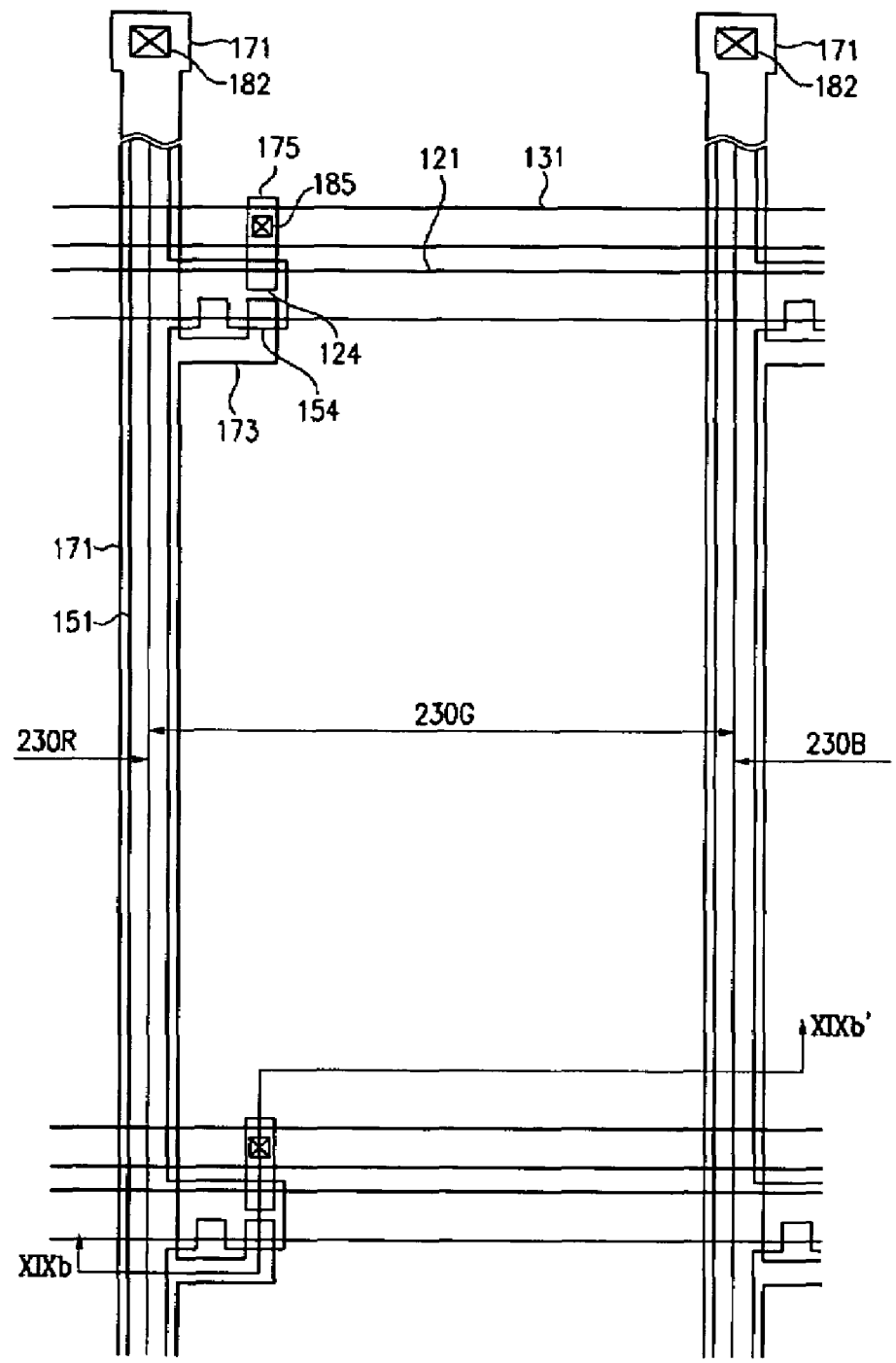

[Fig. 28]
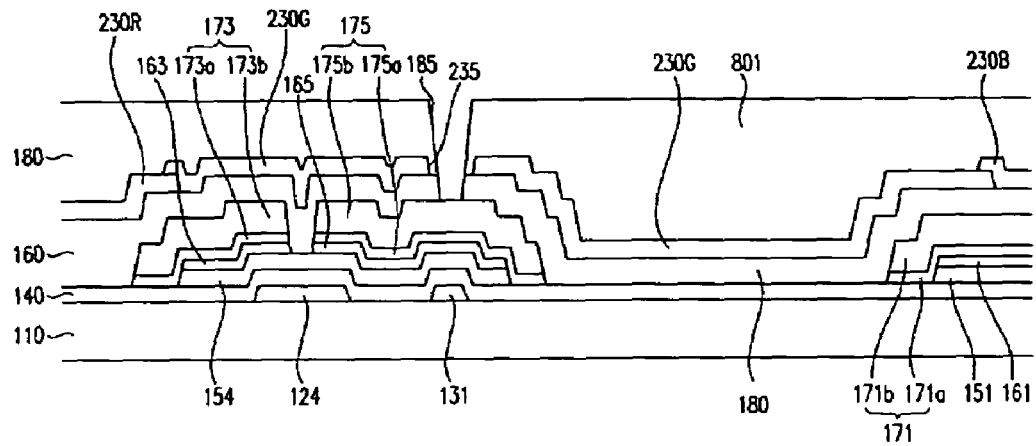
[Fig. 29]
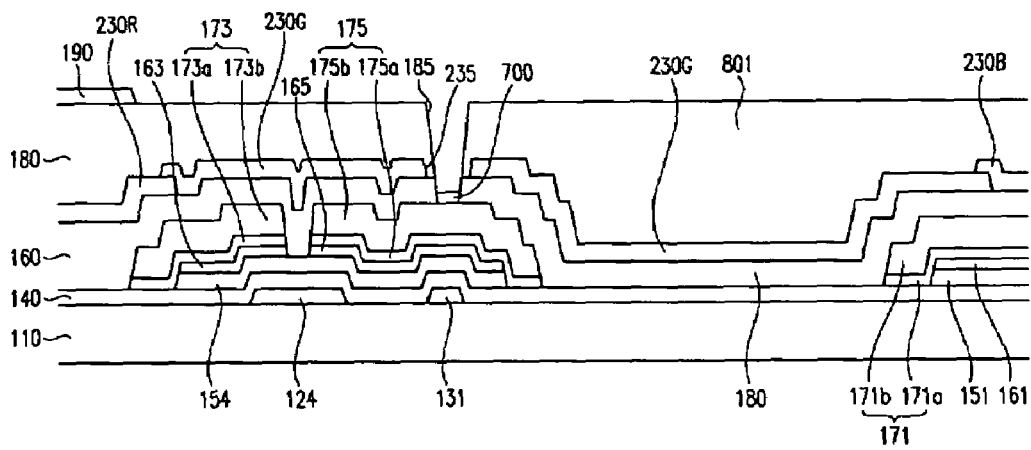

CONTACT PORTION AND MANUFACTURING METHOD THEREOF, THIN FILM TRANSISTOR ARRAY PANEL AND MANUFACTURING METHOD THEREOF

TECHNICAL FIELD

The present invention relates to a contact portion, method for manufacturing the same, a thin film transistor array panel, and a method of fabricating the same.

BACKGROUND ART

Thin film transistor array panel is used as a circuit substrate to individually drive each pixel, such as of liquid crystal display or organic electro luminescence display. The thin film transistor array panel includes a plurality of pixels arranged in a matrix and a plurality of signal lines for driving the pixels such as gate lines for transmitting scanning signals and data lines for transmitting data signals. Each pixel includes a pixel electrode, and a thin film transistor (TFT) connected to the gate lines and the data lines for controlling the data signals.

At this time, signal lines such as gate lines and the data lines includes metal materials, and the pixel electrodes are usually made of transparent conductive material such as indium tin oxide (ITO) and indium zinc oxide (IZO). ITO or IZO in a liquid crystal display may be used as a contact assistant layer to reinforce contact characteristics when connecting the gate lines and the date lines to external drive circuits.

In order to prevent delay or distortion of signals, the signal lines are generally made of materials having low resistivity such as aluminum or aluminum alloy. However, since the physical and the chemical properties of the aluminum or aluminum alloy is not good, that is, the aluminum or aluminum alloy is easily oxidized and broken, when connecting other conductive material in a contact portions, accordingly the characteristics of semiconductor devices are deteriorated. Furthermore, in the case that ITO and IZO as a transparent electrode such as in a liquid crystal display is used to reinforce contact portions of aluminum. However, because of the poor contact properties between aluminum or aluminum alloy and ITO, or IZO, a different material such as Ti, Cr, Mo is then inserted therebetween. Accordingly, the manufacturing method is complicated and production costs are increased.

Furthermore, when removing aluminum in the contact portions to expose a material layer having good contact characteristic, an under-cut structures are frequently generated by over-etching the Al containing metal under a sidewall of the contact portions. The undercut yields disconnection or poor profile of the subsequently-formed layer near the undercut to increase the contact resistance of the contact portions.

DISCLOSURE OF INVENTION

Technical Problem

It is therefore an object of the present invention to provide contact structures having good contact properties of wiring made a material of low resistivity and methods for manufacturing the same.

It is another object of the present invention to provide a thin film transistor array panels having contact structures of good contact properties and methods for manufacturing the same.

It is another object of the present invention to simplify manufacturing methods of thin film transistor array panels for liquid crystal displays.

Technical Solution

A method of manufacturing a contact portion is provided, which includes: forming a first signal line on a substrate; forming a insulating layer covering the first signal line and having a contact hole exposing the first signal line; forming a contact layer on the exposed surface of the first signal through the contact hole; and forming a second signal line connected to the first signal line via the contact layer. Wherein the first signal line is made of Al or Al alloy, and the second signal line is made of ITO or IZO.

The substrate may be soaked in chemical conversion solution including a conductive material to form the contact layer.

The chemical conversion solution may include at least one of W, Zr, Mo, and Cr.

A method of manufacturing a thin film transistor array panel is provided, which includes: forming a gate line on a substrate; forming a gate insulating layer; forming a semiconductor layer; forming an ohmic contact layer; forming a data line and a drain electrode; forming a passivation layer having a first contact hole exposing the portion of the drain electrode; and forming a first contact layer on the exposed surface of the drain electrode through the first contact hole.

The substrate may be soaked in chemical conversion solution including a conductive material to form the contact layer.

The chemical conversion solution may include at least one of W, Zr, Mo, and Cr.

A second contact hole exposing the end portion of the gate line or the data line may be formed in the step of forming the passivation layer, and a second contact layer may be formed on the exposed surface of the gate line or the data line through the second contact hole in the step of forming the first contact layer.

The method may further include forming a storage electrode line with the same layer as the gate line.

The method may further include forming a second contact hole exposing the end portion of the gate line, the data line and the storage electrode line in the step of forming the passivation layer, and forming a second contact layer on the exposed surface of the gate line, the data line and the storage electrode line through the second contact hole in the step of forming the first contact layer.

A contact portion comprising is provided, which includes: a substrate; a first signal line formed on a substrate; a insulating layer covering the first signal line and having a contact hole exposing the first signal line; a contact layer on the exposed surface of the first signal through the contact hole; and a second signal line formed on the insulating layer and connected to the first signal line via the contact layer. Wherein the first signal line is made of Al or Al alloy, and the second signal line is made of ITO or IZO.

The contact layer may include at least one of W, Zr, Mo, Cr, and an alloy including W, Zr, Mo, Cr.

The contact portion may further comprise a lower layer formed under the first signal line, and the lower layer is a conductive layer including at least one of Cr, Ti, Mo, and MoW alloy.

A thin film transistor array panel is provided, which includes: a substrate; a gate line formed on an substrate; a gate insulating layer covering the gate line; a semi-conductor layer formed on the gate insulating layer; a data line intersecting the gate line and having a source electrode overlapping the portion of the semiconductor layer; a drain electrode overlapping the portion of the semiconductor layer; a passivation layer covering the data line and the drain electrode, and having a first contact hole exposing the portion of the drain electrode; a first contact layer formed on the exposed surface of the drain electrode through the first contact hole, and made of a conductive oxide layer; and a pixel electrode formed on the passivation layer and connected to the drain electrode via the first contact layer.

The panel may further comprise a color filter formed on the data line and the drain electrode.

The panel may further comprise a storage electrode line formed with the same layer as the gate line.

The storage electrode line may include Al and Al alloy.

The passivation layer and the gate insulating layer may have a second contact hole exposing the portion of the storage electrode line, the panel may further comprise a second contact layer formed on the exposed portion on the storage electrode line through the contact hole, and a contact assistant connected to the exposed portion of the storage electrode line via the second contact layer.

The passivation layer and the gate insulating layer may have a second contact hole exposing the portion of the storage electrode line, further comprise a second contact layer formed on the exposed portion on the storage electrode line through the contact hole, and a contact assistant connected to the exposed portion of the storage electrode line via the second contact layer.

The panel may further comprise an ohmic contact layer formed between the data line and the drain electrode, and the semiconductor layer, the ohmic contact layer has the same planar shape as the data line and the drain electrode, and the semiconductor layer has the planar shape as the data line and the drain electrode except for the channel portion between the drain electrode and the source electrode.

The first contact layer may include at least one of W, Zr, Mo, Cr, and an alloy including W, Zr, Mo, Cr, and the gate line may include a conductive layer made of Al or Al alloy.

The data line may include a first conductive layer made of Al or Al alloy, and the data line may further comprise a second conductive layer formed under the first conductive layer.

The second conductive layer is made of a conductive layer including at least one of Cr, Ti, Mo, and MoW alloy.

Advantageous Effects

In the TFT array panel according to an embodiment of the present invention, the signal lines made of Al or Al alloy with low resistivity are easily applicable by forming the contact layers, such that the TFT array panel with large scale and high fineness is provided.

BRIEF DESCRIPTION OF THE DRAWINGS

The present invention will become more apparent by describing embodiments thereof in detail with reference to the accompanying drawings in which:

FIG. 1 is a layout view of an exemplary TFT array panel for an LCD according to an embodiment of the present invention;

FIG. 2 is a sectional view of the TFT array panel shown in FIG. 1 taken along the line II-II';

FIGS. 3, 5, 7 and 9 are layout views of the TFT array panel shown in FIGS. 1 and 2 in intermediate steps of a manufacturing method thereof according to an embodiment of the present invention;

FIGS. 4, 6, 8 and 10 are sectional views of the TFT array panel shown in FIGS. 3, 5, 7 and 9 taken along the lines IIIB-IIIB', IVB-IVB', VB-VB', and VI-VI', respectively;

FIG. 11 is a sectional view of the TFT array panel following the step shown in FIG. 10;

FIG. 12 is a layout view of an exemplary TFT array panel for an LCD according to another embodiment of the present invention;

FIG. 13 is sectional view of the TFT array panel shown in FIG. 12 taken along the line IX-IX';

FIGS. 14, 18, and 20 are layout views of the TFT array panel shown in FIGS. 12 and 13 in intermediate steps of a manufacturing method thereof according to another embodiment of the present invention;

FIG. 15 is sectional view of the TFT array panel shown in FIG. 14 taken along the lines XB-XB';

FIG. 16 is a sectional view of the TFT array panel following the step shown in FIG. 15;

FIG. 17 is a sectional view of the TFT array panel following the step shown in FIG. 16;

FIG. 19 is a sectional view of the TFT array panel shown in FIG. 18 taken along the lines XIIIB-XIIIB';

FIG. 21 is sectional view of the TFT array panel shown in FIG. 20 taken along the lines XIVB-XIVB';

FIG. 22 is a sectional view of the TFT array panel following the step shown in FIG. 21;

FIG. 23 is a layout view of an exemplary TFT array panel for an LCD according to another embodiment of the present invention;

FIG. 24 is sectional view of the TFT array panel shown in FIG. 23 taken along the line XVII-XVII';

FIGS. 25 and 27 are layout views of the TFT array panel shown in FIGS. 23 and 24 in intermediate steps of a manufacturing method thereof according to another embodiment of the present invention;

FIG. 26 is sectional view of the TFT array panel shown in FIG. 25 taken along the lines XVIIIB-XVIIIB';

FIG. 28 is sectional view of the TFT array panel shown in FIG. 27 taken along the lines XIXB-XIXB';

FIG. 29 is a sectional view of the TFT array panel following the step shown in FIG. 28.

DESCRIPTION OF THE REFERENCE NUMERALS IN THE DRAWINGS

110: insulating substrate
121: gate line
124: gate electrode
131: storage electrode line
140: gate insulating layer
151, 154: semiconductor layer
161, 163, 165: ohmic contact layer
171: data line
173: source electrode
175: drain electrode
700: contact layer
180: passivation layer
181, 182, 185: contact hole
190: pixel electrode
81, 82: contact assistant

BEST MODE FOR CARRYING OUT THE INVENTION

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described with reference to the accompanying drawings.

First Embodiment

FIG. 1 is a layout view of an exemplary TFT array panel for an LCD according to an embodiment of the present invention, and FIG. 2 is a sectional view of the TFT array panel shown in FIG. 1 taken along the line II-II'.

A plurality of gate lines 121 for transmitting gate signals and a plurality of storage electrode lines 131 are formed on a transparent insulating substrate 110 made of glass or transparent flexible insulator.

Each gate line 121 extends substantially in a transverse direction and a plurality of portions of each gate line 121 form a plurality of gate electrodes 124 of thin film transistor. Each gate electrode 124 may be protruded from the gate lines 121 with a various shape.

Each storage electrode line 131 extends substantially in a transverse direction. Each storage electrode line 131 may include a plurality of projections forming storage electrodes. The storage electrode lines 131 are supplied with a predetermined voltage such as the common voltage, which is applied to a common electrode of the common electrode panel (not shown) of the LCD.

The gate lines 121 and the storage lines are preferably made of low resistivity metal including Al containing metal such as Al and Al alloy for reducing signal delay or voltage drop.

A gate insulating layer 140 preferably made of silicon nitride (SiNx) is formed on the gate lines 121 and the storage lines 131.

A plurality of semiconductor stripes 151 preferably made of hydrogenated amorphous silicon (abbreviated to "a-Si") are formed on the gate insulating layer 140. Each semiconductor stripe 151 extends substantially in a longitudinal direction and has a plurality of projections 154 branched out toward the gate electrodes 124. The width of each semiconductor stripe 151 becomes large near the gate lines 121 such that the semiconductor stripe 151 covers large areas of the gate lines 121.

A plurality of ohmic contact stripes and islands 161 and 165 preferably made of silicide or n+hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are tapered, and the inclination angles thereof are preferably in a range between about 30-80 degrees.

A plurality of data lines 171 and a plurality of drain electrodes 175 separated from each other are formed on the ohmic contacts 161 and 165 and the gate insulating layer 140.

The data lines 171 for transmitting data voltages extend substantially in the longitudinal direction and intersect the gate lines 121 and the storage electrode lines 131.

Each drain electrodes 175 are located on the ohmic contacts 165, and it is separated from the data lines 171. The drain electrodes 175 are disposed opposite the portion of the data lines 171 with respect to a gate electrode 124, and overlap the storage electrode lines 131.

The data lines 171 include a plurality of projections such that the projections forms a source electrode 173 disposed opposite the drain electrode 175. Each set of a gate electrode 124, a source electrode 173, and a drain electrode 175 along with a projection 154 of a semiconductor stripe 151 form a TFT having a channel formed in the semi-conductor projection 154 disposed between the source electrode 173 and the drain electrode 175.

The ohmic contacts 161 and 165 are interposed only between the underlying semi-conductor stripes 151 and the overlying data lines 171 and the overlying drain electrodes 175 thereon and reduce the contact resistance therebetween. The semi-conductor stripes 151 include a plurality of exposed portions, which are not covered with the data lines 171 and the drain electrodes 175, such as portions located between the source electrodes 173 and the drain electrodes 175. Although the semiconductor stripes 151 are narrower than the data lines 171 at most places, the width of the semi-conductor stripes 151 becomes large near the gate lines as described above, to smooth the profile of the surface, thereby preventing the disconnection of the data lines 171. The portion of the semi-conductor stripes 151 may be expended over the storage electrode lines 131.

At this time, the data lines 171 may have an end portion having a large area for contact with another layer or an external device.

The data lines 171 and the drain electrodes 175 are also made of material such as Al and Al alloy.

A passivation layer 180 is formed on the data lines 171 and the drain electrodes 175, and exposed portions of the semi-conductor stripes 151, which are not covered with the data lines 171 and the drain electrodes 175.

The passivation layer 180 is preferably made of low dielectric insulating material such as a-Si:C:O and a-Si:O:F formed by plasma enhanced chemical vapor deposition (PECVD), organic insulator made of photosensitive organic material having a good flatness characteristic or inorganic insulator such as silicon nitride and silicon oxide. The passivation layer 180 may have a double-layered structure including a lower inorganic film and an upper organic film in order to prevent the channel portions of the semiconductor stripes 151 from being in direct contact with organic material.

The passivation layer 180 has a plurality of contact holes 182 and 185 exposing the end portions of the data lines 171 and the drain electrodes 175, respectively. The passivation layer 180 and the gate insulating layer 140 have a plurality of contact holes 181 exposing the end portions of the gate lines 121. The contact holes 182, 184 and 185 can have various shapes such as polygon or circle. The sidewalls of the contact holes 182, 184 and 185 are inclined with an angle of about 30-85 degrees or have stepwise profiles.

A plurality of contact layers 700 are formed on the exposed portions of the data lines 171, the drain electrodes 175, and the gate lines 121 through contact holes 181, 182 and 185, respectively. The contact layers 700 prevent the Al layer of the data lines 171, the drain electrodes 175, and the gate lines 121 through contact holes 181, 182 and 185 to expose to the air, such that the portions of the data lines 171, the drain electrodes 175, and the gate lines 121 are not eroded.

The contact layers 700 are made of material having good contact characteristics with other materials, more preferably conductive material having good contact characteristics with ITO or IZO such as an oxidized conductive material including Zr, Mo, W, or Cr.

The boundary of the contact layers 700 are the same with that of the contact holes 181, 182, 185, because the contact layers 700 are only formed on the exposed portions of the data lines 171, the drain electrodes 175, and the gate lines 121 through contact holes 181, 182 and 185, respectively.

A plurality of pixel electrodes 190, and a plurality of contact assistants 82, and 81, which are preferably made of ITO or IZO, are formed on the passivation layer 180.

A plurality of pixel electrodes 190 and a plurality of contact assistants 81 and 82, which are preferably made of transparent conductive material such as ITO and IZO or reflective conductive material such as Al and Ag, are formed on the passivation layer 180.

The pixel electrodes 190 are physically and electrically connected to the drain electrodes 175 through the contact holes 185 via the contact layer 700 such that the pixel electrodes 190 receive the data voltages from the drain electrodes 175. The pixel electrodes 190 supplied with the data voltages generate electric fields in cooperation with a common electrode on the common electrode panel (not shown), which reorient LC molecules in the LC layer disposed therebetween. A storage capacitor, which is connected in parallel to the LC capacitor CLC, is provided for enhancing the voltage storing capacity. The storage capacitors are implemented by overlapping the pixel electrodes 190 with the storage electrode lines 131. The capacitances of the storage capacitors, i.e., the storage capacitances are increased by overlapping the drain electrodes 175 with the storage electrodes lines 131.

The pixel electrodes 190 overlap the gate lines 121 and the data lines 171 to increase aperture ratio by inserting the passivation layer 180 having low dielectric insulating material therebetween.

The contact assistants 81 and 82 are connected to the exposed portion of the gate lines 121 and the exposed portion of the data lines 171 through the contact holes 181 and 182 via the contact layers 700, respectively. The contact assistants 81 and 82 are not requisites but preferred to protect the end portions of the gate lines 121 and the data lines 171 and to complement the adhesiveness of the end portions and external devices.

At this time, a contact portions are the exposed portions of the gate lines 121, the data lines 171 and the drain electrodes 175 through the contact holes 181, 182 and 185, the contact layers 700 thereon, and the portion of the pixel electrodes 190, and the contact assistants 81 and 82, which are connected to the contact layers 700.

1st EMBODIMENT METHOD

A method of manufacturing the TFT array panel shown in FIGS. 1-2 according to an embodiment of the present invention will be now described in detail with reference to FIGS. 3 to 7 as well as FIGS. 1 and 2.

FIGS. 3, 5, 7 and 9 are layout views of the TFT array panel shown in FIGS. 1 and 2 in intermediate steps of a manufacturing method thereof according to an embodiment of the present invention, FIGS. 4, 6, 8 and 10 are sectional views of the TFT array panel shown in FIGS. 3, 5, 7 and 9 taken along the lines IIIB-IIIB', IVB-IVB', VB-VB', and VI-VI', respectively, and FIG. 11 is a sectional view of the TFT array panel following the step shown in FIG. 10.

A conductive film is sputtered on an insulating substrate 110 such as transparent glass. The conductive film is preferably made of Al containing metal such as Al and Al alloy.

Referring to FIGS. 3 and 4, the conductive film is patterned to form a plurality of gate lines 121 including a plurality of gate electrodes 124, and a plurality of storage electrode lines 131.

Referring to FIGS. 5 and 6, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140.

Two conductive films, a lower conductive film and an upper conductive film are sputtered in sequence. The lower conductive film is preferably made of Ti, Ta, Mo, Mo alloy or Cr, and preferably has a thickness of about 500A. It is preferable that the upper conductive film has a thickness of about 2,500A, and the sputtering target for the upper conductive film includes pure Al or Al alloy.

Referring to FIGS. 7 and 8, the upper conductive film and the lower conductive film are wet-etched and dry-etched, respectively, or both the films are wet etched to form a plurality of data lines 171 including a plurality of source electrodes 173, and a plurality of drain electrodes 175. When the lower film is made of Mo or Mo alloy, the upper and the lower layers can be etched under the same etching conditions. The data lines i71 and the drain electrodes 175 includes the upper film 171$b$ and 175$b$ made of pure Al or Al alloy, and the lower film 171$a$ and 175$a$ made of Ti, Ta, Mo, Mo alloy or Cr, Thereafter, portions of the extrinsic semiconductor stripes 164, which are not covered with the data lines 171, and the drain electrodes 175 are removed to complete a plurality of ohmic contact stripes 161 including a plurality of projections 163 and a plurality of ohmic contact islands 165 and to expose portions of the intrinsic semi-conductor stripes 151. Oxygen plasma treatment preferably follows thereafter in order to stabilize the exposed surfaces of the semiconductor stripes 151.

Next, a passivation layer 180 is formed by depositing silicon nitride, by PECVD of low dielectric material such as a-Si:C:O or a-Si:O:F, or by coating a photosensitive organic insulating material having a good planarization characteristic. Referring to FIGS. 9 and 10, the passivation layer 180 as well as the gate insulating layer 140 is photo-etched to form a plurality of contact holes 181, 182 and 185. When forming the passivation layer made of photosensitive organic insulating material, it is not necessary that the photoresist pattern is used as etch mask, and the passivation layer 180 is exposed and developed in photo process using a photo mask.

Next, referring to FIG. 11, the insulating substrate 110 is soaked in chemical conversion solution to form a plurality of contact layer 700 on the end portion of the gate lines 121 and the data lines 171, and the portion of the drain electrode 175, which are exposed through the contact holes 181, 182 and 185. The chemical conversion solution preferably includes metal material such as Zr, Mo, Cr, W.

After etching the passivation layer 180 to form the contact holes 181, 182 and 185, an aluminum oxidation layers are formed on the exposed portion of the gate lines 121 and the data lines 171, and the drain electrode 175 by being exposed in the air. The aluminum oxidation layers deteriorate the electric contact properties with other subsequent layer.

Next, when the insulating substrate 110 is soaked in chemical conversion solution, Al metal of aluminum oxide layers substitutes for metal material such as W, Zr, Mo, Cr in the chemical conversion solution. Accordingly, the contact layers 700 including as W, Zr, Mo, or Cr are formed on the end portion of the gate lines 121 and the data lines 171, and the portion of the drain electrode 175, and the aluminum oxide layers are removed.

The contact layers 700 is a conductive oxide layer, and the chief ingredient of the contact layers 700 changes depend on the metal element of the chemical conversion solution such as zirconium oxide, tungsten oxide or chromium oxide. For an example, the chemical conversion solution including Na2ZrO4, NaWO3, and F- is used to form the contact layers 700 made of zirconium oxide.

Because the contact layers 700 are formed after the contact holes 181, 182, 185, the contact layers 700 have almost the same planar shapes as the contact holes 181, 182, 185.

Finally, as shown in FIGS. 1 and 2, an ITO or IZO layer with a thickness in a range between about 500A and about 1,500A is sputtered and photo-etched to form a plurality of pixel electrodes 190, and a plurality of contact assistants 81 and 82. At this time, the pixel electrodes 190, and the plurality of contact assistants 81 and 82 are respectively connected to the drain electrode 175, and the end portions of the gate lines 121 and the data lines 171 via the contact layers 700.

In the TFT array panel according to an embodiment of the present invention, when the gate lines 121 and the data lines 171 Al or Al alloy with low resistivity are formed, the process inserting different material to improve contact characteristics can be omitted by forming the contact layers 700. Accordingly, the manufacturing process of the TFT array panel can be simplified, the TFT array panel with large scale and high fineness can easily manufactured.

Furthermore, it is not necessary that the signal lines including aluminum are formed of multi-layered structure, and therefore the problems such as bending of the panel along the longitude direction can be minimized in sputtering process.

Also, since there is no undercut at the contact holes 181, 182 and 185 and thus the contact inferiority in the contact portions are prevented. Accordingly, the reliability of the contact portions can be improved and the contact resistance of the contact portions can be minimized.

At this time, the thickness of the zirconium oxide layer is less than 0.2 um, and the contact layers have sheet resistance of less than 35,000 ohm/cm2

2nd EMBODIMENT STRUCTURE

A TFT array panel for an LCD according to another embodiment of the present invention will be described in detail with reference to FIGS. 12 and 13.

FIG. 12 is a layout view of an exemplary TFT array panel for an LCD according to another embodiment of the present invention, and FIG. 13 is sectional view of the TFT array panel shown in FIG. 12 taken along the line IX-IX.

As shown in FIGS. 12 and 13, a layered structure of a TFT array panel of an LCD according to this embodiment is almost the same as that shown in FIGS. 1 and 2. That is, a plurality of gate lines 121 including a plurality of gate electrodes 124, and a plurality of storage electrode lines 131 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173 and a plurality of drain electrodes 175 are formed on the ohmic contacts 161 and 165, and a passivation layer 180 is formed thereon. A plurality of contact holes 181, 182 and 185 are provided at the passivation layer 180 and/or the gate insulating layer 140, and a plurality of pixel electrodes 190 and a plurality of contact assistants 81 and 82 are formed on the passivation layer 180.

Different from the TFT array panel shown in FIGS. 1 and 2, the semiconductor stripes 151 have almost the same planar shapes as the data lines 171 and the drain electrodes 175 as well as the underlying ohmic contacts 161 and 165, except for the projections 154 where TFTs are provided. That is, the semiconductor stripes 151 include some exposed portions, which are not covered with the data lines 171 and the drain electrodes 175, such as portions located between the source electrodes 173 and the drain electrodes 175.

2nd EMBODIMENT METHOD

Now, a method of manufacturing the TFT array panel shown in FIGS. 12 and 13 according to an embodiment of the present invention will be described in detail with reference to FIGS. 14-15 as well as FIGS. 12 and 13.

FIGS. 14, 18, and 20 are layout views of the TFT array panel shown in FIGS. 12 and 13 in intermediate steps of a manufacturing method thereof according to another embodiment of the present invention; FIG. 15 is sectional view of the TFT array panel shown in FIG. 14 taken along the lines XB-XB'; FIG. 16 is a sectional view of the TFT array panel following the step shown in FIG. 15; FIG. 17 is a sectional view of the TFT array panel following the step shown in FIG. 16; FIG. 19 is sectional view of the TFF array panel shown in FIG. 18 taken along the lines XIIIB-XIIIB'; FIG. 21 is sectional view of the TFT array panel shown in FIG. 20 taken along the lines XIVB-XIVB'; and FIG. 22 is a sectional view of the TFT array panel following the step shown in FIG. 21.

Referring to FIGS. 14 and 15, a plurality of gate lines 121 including a plurality of gate electrodes 124, and a plurality of storage electrode lines 131 are formed on a substrate 110 by photo etching.

As shown in FIG. 16, a gate insulating layer 140, an intrinsic a-Si layer 150, and an extrinsic a-Si layer 160 are sequentially deposited by CVD such that the layers 140, 150 and 160. A conductive layer 170 including a lower film 170a made of Al or Al alloy and an upper film 170b made of metal such as Cr, Ti, Ta, Mo and their alloy is deposited by sputtering, and a photoresist film with the thickness of about 1-2 microns is coated on the conductive layer 170.

The photoresist film is exposed to light through an exposure mask (not shown), and developed such that the developed photoresist has a position dependent thickness.

The photoresist shown in FIGS. 16 includes a plurality of first to third portions with decreased thickness. The first portions located on wire areas A and the second portions located on channel areas B are indicated by reference numerals 52 and 54, respectively, and no reference numeral is assigned to the third portions located on remaining areas C since they have substantially zero thickness to expose underlying portions of the conductive layer 170. The thickness ratio of the second portions 54 to the first portions 52 is adjusted depending upon the process conditions in the subsequent process steps.

The position-dependent thickness of the photoresist is obtained by several techniques, for example, by providing translucent areas on the exposure mask as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to reflow process to flow onto areas without the photoresist, thereby forming thin portions.

The different thickness of the photoresist 52 and 54 enables to selectively etch the underlying layers when using suitable process conditions. Therefore, a plurality of data lines 171 including a plurality of source electrodes 173, and a plurality of drain electrodes 175, as well as a plurality of ohmic contact stripes 161 including a plurality of projections 163, a plurality of ohmic contact islands 165 and a plurality of semi-conductor stripes 151 including a plurality of projections 154 are obtained as shown in FIGS. 18 and 19 by a series of etching steps.

For descriptive purpose, portions of the conductive layer 170, the extrinsic a-Si layer 160, and the intrinsic a-Si layer 150 on the wire areas A are called first portions, portions of the conductive layer 170, the extrinsic a-Si layer 160, and the intrinsic a-Si layer 150 on the channel areas B are called second portions, and portions of the conductive layer 170, the extrinsic a-Si layer 160, and the intrinsic a-Si layer 150 on the remaining areas C are called third portions.

An exemplary sequence of forming such a structure is as follows:
(1) Removal of third portions of the conductive layer 170, the extrinsic a-Si layer 160 and the intrinsic a-Si layer 150 on the wire areas A;
(2) Removal of the second portions 54 of the photoresist;
(3) Removal of the second portions of the conductive layer 170 and the extrinsic a-Si layer 160 on the channel areas B; and
(4) Removal of the first portions 52 of the photoresist.

Another exemplary sequence is as follows:
(1) Removal of the third portions of the conductive layer 170;
(2) Removal of the second portions 54 of the photoresist;
(3) Removal of the third portions of the extrinsic a-Si layer 160 and the intrinsic a-Si layer 150;
(4) Removal of the second portions of the conductive layer 170;
(5) Removal of the first portions 52 of the photoresist; and
(6) Removal of the second portions of the extrinsic a-Si layer 160.

The first example is described in detail.

Referring to FIG. 17, the exposed third portions of the conductive layer 170 on the remaining areas C are removed by wet etching or dry etching to expose the underlying third portions of the extrinsic a-Si layer 160.

Reference numeral 174 indicates portions of the conductive layer 170 including the data lines 171 and the drain electrode 175 connected to each other and lower, and upper films thereof are indicated by reference numerals 174*a* and 174*b*, respectively. The dry etching may etch out the top portions of the photoresist 52 and 54.

Next, the third portions of the extrinsic a-Si layer 160 on the areas C and of the intrinsic a-Si layer 150 are removed preferably by dry etching and the second portions 54 of the photoresist are removed to expose the second portions of the conductors 174. The removal of the second portions 54 of the photoresist are performed either simultaneously with or independent from the removal of the third portions of the extrinsic a-Si layer 160 and of the intrinsic a-Si layer 150. Residue of the second portions 54 of the photoresist remained on the channel areas B is removed by ashing.

The semiconductor stripes 151 are completed in this step, and reference numeral 164 indicates portions of the extrinsic a-Si layer 160 including the ohmic contact stripes and islands 161 and 165 connected to each other, which are called "extrinsic semiconductor stripes."

The lower film 170*a* of the conductive layer 170, the extrinsic a-Si layer 160, and the intrinsic a-Si layer 150 are dry-etched in sequence to simplify the manufacturing process. In this case, the dry etching of the three film and layers 170*a*, 160 and 150 may be performed in-situ in a single etching chamber.

Referring to FIGS. 18 and 19, the second portions of the conductors 174 and the extrinsic a-Si stripes 164 on the channel areas B as well as the first portion 52 of the photoresist are removed.

In case that the exposed portions of the extrinsic semiconductor stripes 164 is removed using the data lines 171 and the drain electrodes 175 as an etch mask after removing the photoresist film.

At this time, top portions of the projections 154 of the intrinsic semiconductor stripes 151 on the channel areas B may be removed to cause thickness reduction.

In this way, each conductor 174 is divided into a data line 171 and a plurality of drain electrodes 175 to be completed, and each extrinsic semiconductor stripe 164 is divided into an ohmic contact stripe 161 and a plurality of ohmic contact islands 165 to be completed.

Referring to FIGS. 20 and 21, a passivation layer 180 is formed by the CVD of a silicon nitride film, by the coating of an acrylic organic insulating film, or by the PECVD of low dielectric insulating material such as a-Si:C:O and a-Si:O:F. Thereafter, the passivation layer 180 and the gate insulating layer 140 are photo-etched to form a plurality of contact holes 181, 182 and 185.

Referring to FIG. 22, the insulating substrate 110 is soaked in chemical conversion solution with the same method as that in previous embodiment to form a plurality of contact layer 700 on the end portion of the gate lines 121 and the data lines 171, and the portion of the drain electrode 175, which are exposed through the contact holes 181, 182 and 185.

Finally, as shown in FIGS. 12 and 13, a plurality of pixel electrodes 190 and a plurality of contact assistants 81 and 82 are formed on the passivation layer 180 by sputtering and photo-etching an ITO or IZO layer.

When the passivation layer 180 includes the organic material having lower dielectric constant, the pixel electrodes 190 are expanded over the data lines 171 to increase the aperture ratio.

At this time, the storage electrode lines 131 may have a contact portion to receive signals such as common voltage from the external device. The contact portion includes a contact hole to expose the portion of the storage electrode lines 131, a contact assistant connected to the storage electrode lines 131, and a contact layer, which is made of conductive oxide layer and is located between the contact assistant and the portion of the storage electrode lines 131.

On the other hand, the THT array panel may include a plurality of gate driving circuit to apply scanning signals to the gate lines 121. At this time, the gate driving circuits may be formed through the same manufacturing method as that of thin film transistors of pixel areas, and a layered structure of the gate driving circuits is almost the same as that of thin film transistor of pixel.

A plurality of thin film transistor consisting of the gate driving circuits are electrically connected to each other via a plurality of signal lines, and the signal lines include the conductive layers made of a layered structure of the gate lines 121 or the data lines 171. At this time, the signal lines may also have a contact portion to connect to the conductive layers to each other, which are located at the different layer. The contact portion includes a contact hole to expose the portion of the conductive layer of the signal lines, a contact assistant connected to the signal lines, and a contact layer, which is made of conductive oxide layer and is located between the contact assistant and the portion of the signal lines.

3rd EMBODIMENT STRUCTURE

Different from the above-described TFT' array panels, a TFT array panel according to this embodiment may further include a plurality of color filters.

A TFT array panel for an LCD according to this embodiment of the present invention will be described in detail with reference to FIGS. 23 and 24.

FIG. 23 is a layout view of an exemplary TFT array panel for an LCD according to another embodiment of the present invention; and FIG. 24 is sectional view of the TFT array panel shown in FIG. 23 taken along the line XVII-XVII'.

As shown in FIGS. 23 and 24, a layered structure of a TFI array panel of an LCD according to this embodiment is almost the same as that shown in FIGS. 1 and 2.

Different from the previous embodiments, a plurality of red, green and blue color filter stripes 230R, 230G and 230B are formed on the passivation layer 180 covering the data lines 171, and the drain electrodes 175. Each of the color filter stripes 230R, 230G and 230B is disposed substantially between adjacent two of the data lines 171 and extends in a longitudinal direction. The color filter stripes 230R, 230G and 230B may be divided into a plurality of color filters disposed in respective pixel areas defined by the gate lines 121 and the data lines 171. Although edges of adjacent color filter stripes 230R, 230G and 230B exactly match with each other, the color filter stripes 230R, 230G and 230B overlap each other to block the light leakage between the pixel areas. The three color filters may overlap each other between the pixel areas on the data lines 171.

The color filter stripes 230R, 230G and 230B are not disposed on a peripheral area which is provided with the contact portions of the gate lines 121 and the data lines 171.

An interlayer insulating layer 801 is formed on the adjacent color filter stripes 230R, 230G and 230B. The interlayer insulating layer 801 prevents the resin of the color filter stripes 230R, 230G and 230B from penetrating into the pixel electrode 190, may be omitted.

In this embodiment, a black matrix of a common electrode panel opposite the TFT array panel can be only formed on the positions correspond to the thin film transistors, such that the aperture ratio of pixels is increased.

3rd EMBODIMENT METHOD

Now, a method of manufacturing the TFT array panel shown in FIGS. 23 and 24 according to an embodiment of the present invention will be described in detail with reference to FIGS. 25-29 as well as FIGS. 23 and 24.

FIGS. 25 and 27 are layout views of the TFT array panel shown in FIGS. 23 and 24 in intermediate steps of a manufacturing method thereof according to another embodiment of the present invention; FIG. 26 is sectional view of the TFT array panel shown in FIG. 25 taken along the lines XVIIIB-XVIIIB'; FIG. 28 is sectional view of the TFT array panel shown in FIG. 27 taken along the lines XIXB-XIXB'; and FIG. 29 is a sectional view of the TFT array panel following the step shown in FIG. 28.

Referring to FIGS. 3 to 8, a plurality of gate lines 121, a plurality of storage electrode lines 131, an gate insulating layer 140, a plurality of semiconductor stripes 151, a plurality of ohmic contact stripes and islands 161 and 165 a plurality of data lines 171 including a plurality of source electrodes 173, and a plurality of drain electrodes 175 are formed on an insulating substrate 110.

Referring to FIGS. 25 to 26, after depositing a passivation layer 180 made on inorganic material such as silicon nitride or silicon oxide, three photosensitive film are sequentially coated on the upper surface of the insulating substrate 110. The three negative photosensitive films are a water-insoluble dispersion solution respectively containing a photopolymerizable photosensitive composition including photopoly-merization initiators, monomers, binders, etc., and one of red, green and blue pigments. Thereafter, the photosensitive films are respectively exposed to light through a mask for color filter to form a plurality of color filter stripes 230R, 230G and 230B. Each color filter stripes 230R, 230G and 230B have a plurality of contact holes 235 exposing the portion of the drain electrodes 175

Referring to FIGS. 27 and 28, a interlayer insulating layer 801 is formed by the coating of an organic insulating film having low dielectric less than 4.0, or by the PECVD of low dielectric insulating material such as a-Si:C:O and a-Si:O:F. Thereafter, the interlayer insulating layer 801 is photo-etched to form a plurality of contact holes 182 and 185 respectively exposing the portion of the drain electrode 175 inside the contact hole 235 and the end portion of the data lines 171.

Next, referring to FIG. 29, the insulating substrate 110 is soaked in chemical conversion solution to form a plurality of contact layers 700 on the end portion of the data lines 171 and the portion of the drain electrode 175, like as previous embodiments.

Finally, as shown in FIGS. 23 and 24, an ITO or IZO layer is sputtered and photo-etched to form a plurality of pixel electrodes 190, and a plurality of contact assistants 82.

In the TFT array panel according to an embodiment of the present invention, the signal lines made of Al or Al alloy with low resistivity are easily applicable by forming the contact layers, such that the TFT array panel with large scale and high fineness is provided.

While the present invention has been described in detail with reference to the preferred embodiments, those skilled in the art will appreciate that various modifications and substitutions can be made thereto without departing from the spirit and scope of the present invention as set forth in the appended claims.

The invention claimed is:

1. A method of manufacturing a contact portion, the method comprising:
    forming a first signal line on a substrate;
    forming an insulating layer on the first signal line and having a contact hole exposing a surface of the first signal line;
    forming a contact layer only on the exposed surface of the first signal line through the contact hole by soaking the substrate in chemical conversion solution including a conductive material; and
    forming a second signal line connected to the first signal line via the contact layer,
    wherein the first signal line comprises one of Al and Al alloy, and the second signal line comprises one of indium tin oxide (ITO) and indium zinc oxide (IZO).

2. The method of claim 1, wherein the chemical conversion solution comprises at least one of W, Zr, Mo, and Cr.

3. A method of manufacturing a thin film transistor array panel, the method comprising:
- forming a gate line on a substrate;
- forming a gate insulating layer;
- forming a semiconductor layer;
- forming an ohmic contact layer;
- forming a data line and a drain electrode;
- forming a passivation layer having a first contact hole exposing a portion of the drain electrode; and
- forming a first contact layer only on the exposed portion of the drain electrode through the first contact hole by soaking the substrate in chemical conversion solution including a conductive material.

4. The method of claim 3, wherein the chemical conversion solution comprises at least one of W, Zr, Mo, and Cr.

5. The method of claim 3, wherein the forming the passivation layer comprises forming a second contact hole exposing an end portion of one of the gate line and the data line.

6. The method of claim 5, further comprising forming a second contact layer on the exposed end portion of the one of the gate line and the data line through the second contact hole, wherein the forming the second contact layer is performed simultaneously with the forming the first contact layer.

7. The method of claim 3, further comprising forming a storage electrode line, wherein the forming the storage electrode line is performed simultaneously with the forming the gate line.

8. The method of claim 7, wherein a second contact hole exposing an end portion of the storage electrode line is formed in the passivation layer.

9. The method of claim 8, further comprising forming a second contact layer on the exposed end portion of the storage electrode line through the second contact hole wherein the forming the second contact layer is performed simultaneously with the forming the first contact layer.

10. A contact portion comprising:
- a substrate;
- a first signal line formed on the substrate;
- an insulating layer covering the first signal line and having a contact hole exposing a surface of the first signal line;
- a contact layer disposed only on the exposed surface of the first signal line through the contact hole; and
- a second signal line formed on the insulating layer and connected to the first signal line via the contact layer,
- wherein the first signal line comprises one of Al and Al alloy, and the second signal line comprises one of indium tin oxide (ITO) and indium zinc oxide (IZO).

11. The contact portion of claim 10, wherein the contact layer comprises at least one of W, Zr, Mo, Cr, and an alloy including at least one of W, Zr, Mo, and Cr.

12. The contact portion of claim 10, further comprising a lower layer formed under the first signal line.

13. The contact portion of claim 12, wherein the lower layer is a conductive layer including at least one of Cr, Ti, Mo, and MoW alloy.

14. A thin film transistor array panel comprising:
- a substrate;
- a gate line formed on the substrate;
- a gate insulating layer covering the gate line;
- a semiconductor layer formed on the gate insulating layer;
- a data line intersecting the gate line and comprising a source electrode, the source electrode overlapping the semiconductor layer;
- a drain electrode overlapping the semiconductor layer;
- a passivation layer disposed on the data line and the drain electrode, and having a first contact hole exposing a portion of the drain electrode;
- a first contact layer formed on the exposed surface of the drain electrode through the first contact hole, and comprising a conductive oxide layer; and
- a pixel electrode formed on the passivation layer and connected to the drain electrode via the first contact layer.

15. The panel of claim 14, further comprising a color filter formed on the data line and the drain electrode.

16. The panel of claim 14, further comprising a storage electrode line formed with the same layer as the gate line.

17. The panel of claim 16, wherein the storage electrode line includes Al and Al alloy.

18. The panel of claim 16, wherein the passivation layer and the gate insulating layer have a second contact hole exposing a portion of the storage electrode line, and
the panel further comprises:
- a second contact layer formed on the exposed portion on the storage electrode line through the second contact hole; and
- a contact assistant connected to the exposed portion of the storage electrode line via the second contact layer.

19. The panel of claim 18, wherein the second contact layer comprises at least one of W, Zr, Mo, Cr, and an alloy including W, Zr, Mo, Cr.

20. The panel of claim 14, wherein
one of the passivation layer and the gate insulating layer has a second contact hole exposing a portion of one of the gate line and the data line, and
the panel further comprises:
- a second contact layer formed on the exposed portion on the gate line or the data line through the second contact hole; and
- a contact assistant connected to the exposed portion of the one of the gate line and the data line via the second contact layer.

21. The panel of claim 20, wherein the second contact layer comprises at least one of W, Zr, Mo, Cr, and an alloy including W, Zr, Mo, Cr.

22. The panel of claim 14, further comprising an ohmic contact layer formed between the data line and the semiconductor layer and between the drain electrode and the semiconductor layer.

23. The panel of claim 22, wherein the ohmic contact layer has the same planar shape as the data line and the drain electrode, and the semiconductor layer has the same planar shape as the data line and the drain electrode except for a channel portion between the drain electrode and the source electrode.

24. The panel of claim 14, wherein the first contact layer comprises at least one of W, Zr, Mo, Cr, and an alloy including W, Zr, Mo, Cr.

25. The panel of claim 14, wherein the gate line includes a conductive layer made of Al or Al alloy.

26. The panel of claim 14, wherein the data line includes a first conductive layer made of Al or Al alloy.

27. The panel of claim 26, wherein the data line further comprises a second conductive layer formed under the first conductive layer.

28. The panel of claim 27, wherein the second conductive layer is made of a conductive layer including at least one of Cr, Ti, Mo, and MoW alloy.

* * * * *